United States Patent
Tomion

(10) Patent No.: US 6,404,089 B1
(45) Date of Patent: Jun. 11, 2002

(54) ELECTRODYNAMIC FIELD GENERATOR

(76) Inventor: Mark R. Tomion, 2938 Ferguson Corners Rd., Geneva, NY (US) 14456

(*) Notice: Subject to any disclaimer, the term of this patent is extended or adjusted under 35 U.S.C. 154(b) by 0 days.

(21) Appl. No.: 09/621,152

(22) Filed: Jul. 21, 2000

(51) Int. Cl.$^7$ .............................. H02K 1/00; H02K 5/00
(52) U.S. Cl. ........................ 310/162; 290/1 A; 290/1 R; 244/23 A; 244/23 C
(58) Field of Search ................................. 310/162–168, 310/171, 112, 308–309, 74, 68 R, 90, 118, 216, 261, 254, 89, 258; 290/1 R, 1 A, 49; 244/1 N, 130, 62, 23 C, 205, 23 A

(56) References Cited

U.S. PATENT DOCUMENTS

| | | | |
|---|---|---|---|
| 1,889,208 A | * 11/1932 | Masterson et al. .......... | 310/126 |
| 2,949,550 A | 8/1960 | Brown | |
| 3,071,705 A | 1/1963 | Coleman et al. | |
| 3,177,654 A | 4/1965 | Gradecak | |
| 3,464,207 A | 9/1969 | Okress | |
| 3,620,484 A | * 11/1971 | Schoppe ...................... | 244/130 |
| 3,662,554 A | * 5/1972 | Broqueville ................ | 244/1 N |
| 3,774,865 A | * 11/1973 | Pinto ......................... | 244/23 C |
| 4,733,099 A | 3/1988 | Hutson, Jr. | |
| 4,789,801 A | 12/1988 | Lee | |
| 4,900,965 A | 2/1990 | Fisher | |
| 5,291,734 A | * 3/1994 | Sohnly ......................... | 60/202 |
| 5,382,833 A | 1/1995 | Wirges | |

FOREIGN PATENT DOCUMENTS

| | | |
|---|---|---|
| GB | 2312709 | 5/1997 |
| WO | WO85/03053 | 7/1985 |

* cited by examiner

*Primary Examiner*—Tran Nguyen
(74) *Attorney, Agent, or Firm*—Stephen B. Salai, Esq.; Brian B. Shaw, Esq.; Harter, Secrest & Emery LLP

(57) ABSTRACT

This device is a brushless high-voltage electrical generator, requiring suitable means of input rotary torque, for purposes of producing a very-high-energy external electrodynamic field or continuous quasi-coherent DC corona or arc discharge of uniform current density which completely encloses the machine's conductive housing. This housing is divided into distinct electrical sections and contains a flat conductive rotor which electrically links separate negative and positive housing sections and upon which a plurality of toroidal generating coils are rotatably mounted. Circular arrays of stationary permanent magnets are affixed within the housing which induce a constant DC voltage within said coils upon their rotation. The primary voltage so-generated is electrostatically impressed across the rotor such that great quantities of electronic charge may be transported between the opposite polarity sections of the housing, in such a manner that a much higher secondary voltage is caused to appear across interposed neutral sections thereof, and the resulting external breakdown current once initiated is independent of the generating coils' ampacity. Ancillary mechanical, electrical, an/or electronic features may be attached upon or within the housing to aid in harnessing and controlling the useful effects associated with the external dynamic electric field produced by the device.

48 Claims, 9 Drawing Sheets

ELECTRODYNAMIC FIELD GENERATOR

FIELD OF THE INVENTION

The present invention is related in general to rotary direct current (DC) electrical generators which incorporate permanent magnet fields, and in particular to similar electromechanical generating devices whose principal purpose is to produce a useful continuous high-voltage DC corona discharge. This invention also pertains to the field of aerospace vehicles which are capable of propulsion through the utilization of an ultra-high-voltage corona or arc discharge of a special type and form.

DESCRIPTION OF RELATED ART

In order to provide background information so that the present invention may be completely understood and appreciated in its proper context, reference is made hereinbelow to a number of related art patents. These cited references contain certain similarities to the present invention, primarily related to the objective of producing electrically-developed thrust. However, key differences and limitations with regard to achieving this objective are in evidence.

The related art disclosed in U.S. Pat. No. 2,949,550 proposes three attendant objects which are quite similar to certain of the objects of the present invention: (i) to provide an apparatus for the direct conversion of electrical potential to usable kinetic energy; (ii) to provide such an apparatus having a hollow body or housing which contains a source of high electrical potential; and (iii) to provide a self-propelling vehicular apparatus which includes a pair of electrically conductive body portions joined by an insulative portion, whereby said conductive portions constitute electrodes. A further similarity is that the vehicular embodiment proposed preferably be of a circular disc shape somewhat thicker in its center than at its edges. The device set forth in this Patent just cited is noticeably different from the present invention, however, in that a positive voltage is applied to the housing periphery and a negative voltage is applied at the central axis. The proposed arrangement is furthermore limited to operation within a gaseous dielectric medium, upon which it is reliant for the production of the claimed motive force, and is to be operated at a potential gradient less than that which would produce a visible corona. This device moreover makes no provisions for the production and/or extraction of vast quantities of useful thermal kinetic energy, as the present invention does.

The related art disclosed in U.S. Pat. No. 3,071,705 is based on three empirical principles of electrostatics which also figure prominently in explaining the actual shape of the discharge current field that will be produced by the present invention: (i) electrostatic lines of force tend to concentrate on the surface of a charged conductor in those places with the smallest radius of curvature; (ii) they are normal to the surface from which they emanate; and (iii) they do not cross but will bend under the influence of another charged body. The device set forth in this Patent just cited is in fact quite similar to that of the Patent cited immediately before, in that relatively massive positive atmospheric ions and entrained neutral air molecules are repelled from the positive electrode toward the negative electrode along a linear axis—thereby inducing an air flow or "electric wind" which represents the fundamental source of thrust. It is therefore once again limited to operation in a gaseous dielectric medium, and does not make use of a flow of negative and greatly less massive electron current in the course of thrust production—which may achieve comparatively enormous acceleration and even relativistic velocity and specific impulse at a similar given level of applied potential gradient—as the present invention does.

The related art disclosed in U.S. Pat. No. 3,177,654 actually addresses the issue of producing electrically-developed thrust which is not limited to atmospheric operation, and the stated primary object thereof is to provide a propulsion system for enabling controlled flight in the atmosphere which may continue extensively into space without changing the system's basic operation. One embodiment thereof also proposes a circular disc-shaped vessel wherein high-voltage electrode elements ionize atmospheric gases by corona discharge, and a pulsed electromagnet arrangement causes the ejection of the resultant plasma from the propulsion chamber—producing thrust by reaction. This device furthermore addresses the issue of producing local thrust differential(s) on the body or housing thereof, for purposes of flight maneuvering and/or directional control, by providing for a plurality of such pulsed discharge propulsion units arranged in concentric rings (within the discoid body) and having individual divergent nozzles. As such, however, the device set forth in this Patent just cited actually constitutes an ionized jet propulsion method, requiring the use of either a gaseous medium like air or the onboard storage and release of relatively massive ionizable reaction material for any operational capability in space. Moreover, the pulsed mode of operation used, which limits the ionizing potential gradient to a value of less than breakdown field intensity, significantly restricts the level of power produced as thrust as compared to the continuous DC discharge field current produced by the present invention—at voltages which may be greatly in excess of breakdown intensity. Finally, this said device relies upon an unspecified source of generated electrical power in operation which must be assumed would have to be nuclear if conventional in nature, for said device to avoid otherwise having to carry a massive and range-limiting onboard store of fuel, and not upon convenient and protracted-use permanent magnets of high energy density as the prime energy source (as the present invention does).

U.S. Pat. No. 3,464,207 discloses a quasi-corona aerodynamic vehicle which bears only a limited relationship to the present invention, but which is referenced nonetheless as being further indicative of the predominant trend in conceptualization in relation to devices intended for producing electrically-developed thrust. This device also relies upon pulsed corona discharge operation between spaced electrodes at less than breakdown field intensity, thereby greatly constraining the propulsive power obtained. It is furthermore effective only in a gaseous dielectric medium and is based upon an electric wind pressure gradient arising of an admitted incompletely-understood mechanism. This same device evidences a great deal of theoretical complexity and construction material specificity, which might seem to indicate a narrow range of feasibility. Such attributes are not uncommon in the field of electrical aerospace propulsion, and are, to a degree, shared even by the present invention. Nevertheless, it is interesting to note that sizeable thrust in the form of an aerodynamic pressure gradient or lift of up to 30 lbs./ft$^2$ of external electrode area or more is asserted to be obtainable from said same device by utilizing asymmetrical electrodes or electrode arrays, rather than using electrodes or electrode arrays of approximately equal area (as the present invention does)—which therefore present a uniform cross section of discharge current conduction.

PCT Application WO 85/03053 discloses a flying apparatus whose primary similarity to the present invention is that it incorporates a hollow annular flywheel which provides gyroscopic stability and encircles a relatively stationary central cabin and/or payload area. The device set forth therein also provides free-rolling means to center and stabilize the flywheel or rotor within a discoid housing, and addresses the issue that horizontal flight maneuvering and/or directional control may be accomplished by altering the local angular acceleration of the rotor—as does the present invention. This said other device, however, relies upon the questionable concept that the very large angular momentum of the rotating flywheel is somehow able to compensate the potential energy caused by gravitation and that the overall weight of the apparatus may thereby be annulled. Vertical lift must then be provided for said device in operation by atmospheric thermal updraft means, and no electrical discharge means are utilized to produce a force of lift or thrust.

The device set forth in UK Patent GB 2 312 709 A is a flying craft which is essentially disc- or saucer-shaped and which has a central axial post electrode and a spaced enclosing ring electrode whereby an electrical arc may be struck between the two, to either ignite fuel introduced via nozzles or greatly heat an exhausted air flow produced by fan means. Thus, this device actually provides hybrid jet or turbo-fan means for producing propulsive thrust, and utilizes direct electrical discharge not as the primary source of thrust but to enhance thrust produced by other means. To this end, said device must therefore operate solely in a gaseous atmosphere and/or carry onboard a range-limiting store of combustible fuel. This same device does, however, utilize powerful magnetic fields to impart a rotational and de-randomizing aspect to the arc discharge, thereby promoting a more uniform distribution of the arc discharge field's energy, as does the present invention.

In summary, a number of similar or significant electrical, magnetic, and mechanical features of the several related art devices have been examined but, whatever the precise merits and advantages thereof, none of said devices achieve the correct combination of such features required to fulfill the purposes of the present invention. In this respect it may be stated that none of these related art devices attain the distinction of being able to operate extensively in the vacuum of space without the onboard storage of relatively massive reaction material for the production of thrust. Furthermore it would appear that none of these same devices utilize a charged conductive housing comprising suitably disposed electrodes and/or electrode arrays to create and control an asymmetrical electromotive field of force on itself without expelling a reaction mass, whether in a gaseous dielectric medium or the vacuum of space, to achieve a propulsive object as the present invention does. Finally, it is observed that none of the aforementioned related art devices can develop this type of useful thrust-producing electrodynamic field in a manner which allows more than one objective function to be fulfilled thereby, such as the production of useable thermal kinetic energy and/or the development of potential signal communications capability.

SUMMARY OF THE INVENTION

The present invention is a brushless permanent magnet electrical generator which produces a useful ultra-high-energy external electrodynamic field, or continuous quasi-coherent DC corona or arc discharge of uniform current density, that completely surrounds and encloses the machine's symmetrically disc-shaped conductive housing and tends in consequence toward a balanced bihemitoroidal shape.

The invention incorporates a uniform arrangement of stationary electromagnetic armatures which may be employed as a group to impart a holistic and de-randomizing rotational force to the external discharge current that acts to inhibit the formation of concentrated arc streamer or channel phenomena, and thus to assist in rendering the electrodynamic field quasi-coherent in nature. The arrangement of electromagnetic armatures in said generator acting as a group simultaneously also contribute a portion of the machine's required input rotary torque upon the current-carrying rotor assembly thereof.

This invention provides a permanent magnet high-voltage generator wherein the primary DC voltage induced within its rotating coils is electrostatically impressed across the conductive rotor assembly thereof, in a brushless manner utilizing vacuum tube cutoff bias techniques, such that a secondary DC corona or arc discharge current is thereby initiated about the housing thereof which is orders of magnitude larger than the operating current through the said coils.

The said high-voltage primary generator of the invention then has a housing or hull which is divided into separate negative (emitter), neutral, and positive (collector) electrical sections, such that the continuous external flow of such discharge current is best facilitated and conducted internally by the proximal rotor, and wherein suitable means to circulate one or more form(s) of liquid coolant through any one or more of said housing sections may be employed for purposes of extracting an extremely high level of recoverable thermal energy (arising from such discharge current)— which is intended principally for use in the large-scale production of electrical power and/or distilled or desalinated water.

This invention as an electrodynamic field generator also provides an appreciable and practical level of electrically-developed thrust, from the relativistic impulse of an induced ultra-high-voltage external DC arc discharge current incident upon its positive (collector) housing sections, which may be rendered variably non-isometric in nature and therefore directionally propulsive by means of selectively controlling: (i) the resistance of the brushless electrical linkages between the positive housing sections and the proximal current-carrying rotor; and/or (ii) the magnetic flux output of the various stationary electromagnetic armatures.

The invention as an ultra-high-energy field generator furthermore presents a unique yet practicable method of producing a variable electromagnetic and/or gravimetric signal, by means of which useful information may be both transmitted to and received by a separate similar device, in further harnessing the effects associated with the device's external electromotive field. The relationship of said field effects to quantum potential vacuum fluctuation theory just now being studied, which may allow the devising of such a signal having an unconventional nature, is referred to again below.

In any event, the electrodynamic field generator described may be feasibly manufactured and marketed in various sizes according to need or desire in pursuit of its remarkable objects; may be operated either in a gaseous dielectric medium or in the vacuum of space; and may incorporate ancillary mechanical, electrical, and/or electronic features upon or within its housing to accomplish all the objects set forth hereinabove.

Briefly, in accordance with the preferred embodiment of the invention, first provided is a flat annular segmented rotor of very high conductive ampacity which is rendered capacitive in nature by the attachment of suitably paired electrode rings. Alternating in placement amidst such capacitive ring pairs are also attached on the rotor a series of toroidal generating coils of very large mean radius relative to the cross-sectional radius thereof. The resultant composite rotor assembly is then rotatably mounted within a sectional conductive housing. The potential energy inherent in the fields of ring-shaped stationary permanent magnets, which are affixed in concentric circular arrays within the housing, is utilized to electrically polarize the rotor across its radial annular width by means of the "primary" DC voltage created upon relative rotational motion between such coils and magnets. The thereby polarized rotor is electrically linked on one hand (about its positive inner circumference) to two axially-central collector housing sections, by electrostatic induction via a system of plane-parallel electrode elements, and on the other hand (about its negative outer circumference) to two radially-peripheral emitter housing sections across an evacuated space charge chamber. The rotor's subsequent transportation and storage of electronic charge between the proximal opposite-polarity sections of the housing causes a much higher "secondary" voltage to appear across interposed neutral sections thereof and results in a continuous ultra-high-energy DC discharge current flow about the housing externally and across the rotor internally.

BRIEF DESCRIPTION OF THE DRAWINGS

The benefits and advantages attendant to the invention and its objects as discussed hereinabove are best illuminated through the following drawings and description.

DESCRIPTION OF THE PREFERRED EMBODIMENT

Method of Operation

Figure 1:
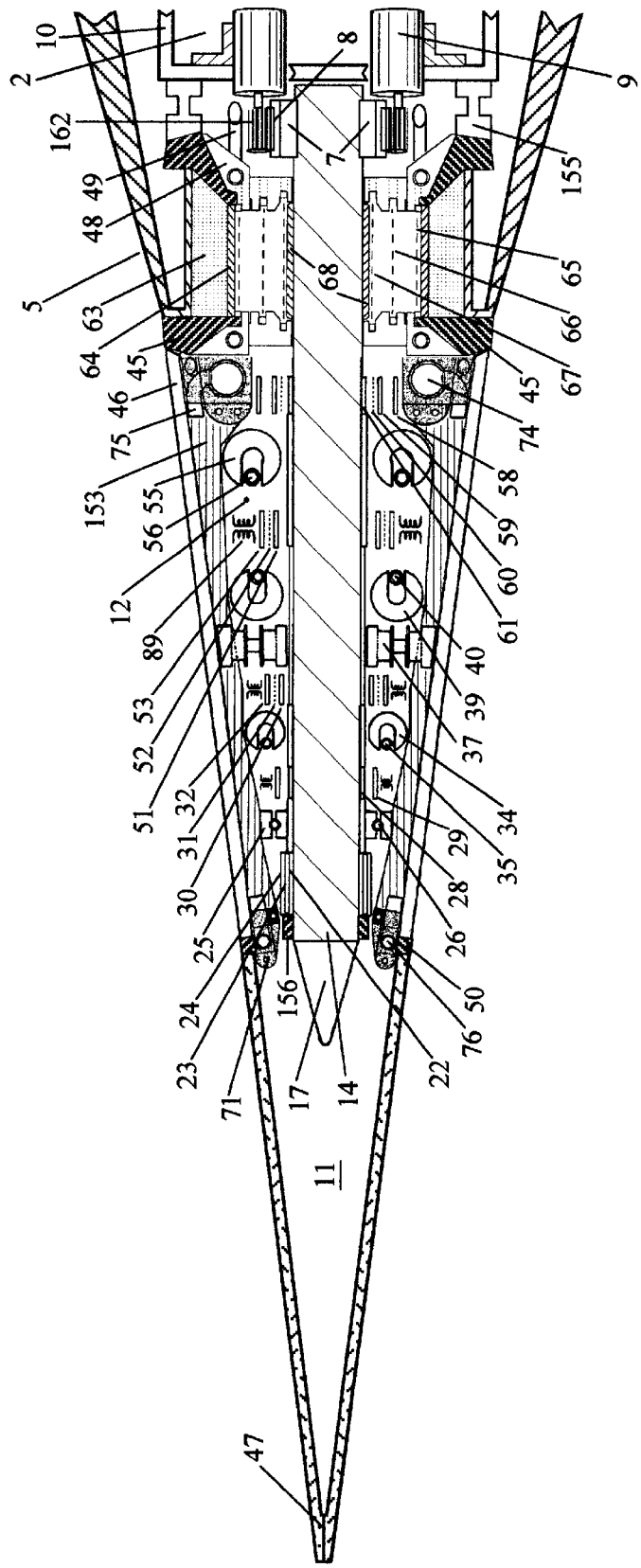
FIG. 1 shows a side sectional view of the invention's peripheral and principal working structure, comprising a rotor assembly as well as frame-mounted elements.

The invention disclosed herein is an Electrodynamic Field ("EDF") Generator. The primary challenge involved in fulfilling the objects of the present invention is how to generate and maintain a multi-megavolt potential difference across the exterior sectional housing which is not immediately neutralized due to uncontrolled direct arc discharge. The first part of the problem in this respect is that it is not possible to produce this kind of voltage directly within a traditional generating coil arrangement, so the voltage applied to the charged housing sections must be achieved by special electrostatic means. Secondly, the discharge current must be produced and conducted internally in such a manner that: (i) only a tiny percentage thereof is actually conducted by the generating coils (within their very limited ampacity compared to that of the rotor); and (ii) the negative and positive housing sections are each charged faster than they are discharged until an enormous equilibrium field potential difference is established which is a sum of roughly equal negative and positive housing section voltages.

Having thus stated the principal parts of the overall problem, it is perhaps best to examine and explain the means to its solution in the reverse order. Therefore, it is deemed of fundamental import to realize that the EDF Generator's housing configuration as proposed will demonstrate a significant static capacitance, despite its unusual geometry, given the fact that the negative and positive sections of its housing are to have essentially equal surface areas. This simple precept ensures two very important consequences: (i) that the voltage across the housing will attain a value representing equal negative and positive potentials, in reliance upon the absence of a fixed ground reference, given induced surface charge densities which are sufficient to cause a continuous 'leakage' current between the opposite-polarity sections thereof; and (ii) that a leakage current between the opposite-polarity housing sections will tend to assume a relatively uniform cross section and current density in response to a calculable level of non-uniform surface charge density between non-parallel but equal-area 'plates'. Thus, it is possible to determine using traditional formulas just how much electron charge must be stripped from the positive housing sections, and stored in ballast capacitors, in order to establish a positive surface charge density which corresponds to the desired housing or hull potential difference.

Next, the Generator must, and will, be able to charge these positive housing sections (by stripping them of native electrons) far faster than the positive surface charge so-created is neutralized by corona or arc discharge from the negative housing sections. Because these discharge current electrons will ultimately attain a transit time approaching zero, this in turn means that it must be "easier" per volt to strip negative charge from the positive sections—using a field induction system which is comprised of "primary electrode arrays"—than it is to deliver this charge to the negative sections across a vacuum chamber using relatively massive rotor-mounted field emitters.

It can be shown that the potential difference across said primary arrays will tend to be equal and opposite in operation as proposed to that across such vacuum chamber, in part due to the Faraday shielding principle, and the negative 'plate' voltage of the capacitive housing will naturally tend toward numeric equality with that of the positive sections by electrostatic induction. Therefore, the stationary electron-emitting primary cathodes which link the positive sections of the housing to the rotor are to have a much lower surface work function (and higher emissivity) than the rotating electron-emitting elements which link the rotor with the negative housing sections. This criterion is achieved by thorium-impregnating these cathodes (to stimulate their emissivity) and by not so-impregnating the rotor field emitters.

The relationship just described establishes what electrical engineers refer to as an 'instantaneous charge differential' with respect to these two sets of components as operated at equal but opposite charging voltages or potential differences, and the ratio of their respective electron emissivities will thus define the maximum ratio by which the said secondary field voltage (across the exterior housing) can be expected to exceed that in evidence across the stationary internal primary electrode arrays. This ratio will hereinafter be referred to as the "primary voltage expansion ratio", and the instantaneous charge differential concept as well as its relationship to the said voltage expansion ratio will be explained in further detail in a pertinent section to follow. It is important to note at this point, however, that for this voltage expansion to be realized it must and will be supported by ballast capacitors having suitable total capacitance as outlined hereinabove, which provide a corresponding force of electrostatic induction.

Finally, a method of impressing as large a primary DC voltage across the rotor as may practicably be developed in the device's principal generating system must and will be employed, without such "Primary Power System" circuit conducting more than a minute percentage of the discharge current thereby initiated. To do so, and in a manner that requires no brushes, vacuum tube cutoff bias technique is utilized in the present invention: whereby such primary voltage is electrostatically induced upon the rotor between two sets of capacitive electrode ring pairs (in vacuo), yet the current flow across these rotor-mounted induction electrode arrays—and through the principal generating circuit itself—is absolutely minimized by the application of a control grid voltage which is substantially negative with respect to the corresponding cathodes.

At a certain relative potential, the electrostatic force exerted by such control grid(s) on rotor circuit cathode-emitted electrons is sufficient to all but completely cut off the flow of DC current across these rotor induction arrays; yet the primary DC voltage is transmitted to the large conductive rotor segments such that a comparatively huge charging current between the opposite-polarity housing sections is initiated and maintained (across the rotor)—which subsequently expresses the expanded secondary voltage as a discharge current about the housing. Thus, an analogy could be made in describing the EDF Generator as a DC equivalent for boosting voltage by electrostatic induction means to the AC transformer (for boosting AC voltage by electromagnetic induction means).

General Form of the Invention

Accordingly, referring to FIGS. 1 through 4, the present invention constitutes a novel form of brushless permanent magnet electrical generator for producing a useful ultra-high-energy external electrodynamic field, or continuous quasi-coherent DC corona or arc discharge of essentially uniform current density, and as such the Generator fundamentally comprises and incorporates:

[A] a flat conductive rotor (6) principally formed of a large number of evenly-spaced individual metallic conductors or segments (14) and an equal number of conductive electron-emitting elements or field emitters (17), radially arranged in an annular flywheel configuration rather like the rotatable deck of a carousel, which are all connected in parallel electrically by the attachment of a thin metallic electrode ring (68) about the positive inner circumference of each of the two major flat faces of the annular flywheel thus formed and by the attachment of another such ring (22) about the negative outer circumference of each such flat rotor face;

[B] a principal electrical generating system mounted on said rotor and used to create a very high primary DC voltage within a plurality of rotating toroidal field coils (35)(40)(56) by electromagnetic induction with an equal number of circular arrays of ring-shaped stationary permanent magnets (34)(39)(55) (which are positioned adjacent and concentric thereto), such that an internal primary discharge current may thereby be initiated between the rotor (6) and a housing electron "Emitter Ring" (47)—across an evacuated space charge chamber (11)—which is orders of magnitude larger than the operating current through said field coils;

[C] a conductive exterior housing (1) divided into a plurality of distinct electrical sections—negative (3), neutral (4), and positive (5)—which may be charged from the internal rotor by electrostatic induction and/or by such primary discharge current (as the case may be) and within an evacuated induction compartment (12) of which said rotor (6) as an assembly, including the said generating coils attached thereto, is rotatably mounted;

[D] a plurality of individual systems of stationary plane-parallel electrode elements (64)–(67) which electrically link the polarized rotor (6) by electrostatic induction about its positive inner circumference (within said evacuated compartment (12)) to two axially-central electron collector housing sections (5), and a plurality of similar individual systems of rotor-mounted plane-parallel electrode rings and/or radial electrode elements which may be utilized to connect a principal portion of the individual DC voltage outputs of said rotating field coils in opposed series-parallel across such composite rotor assembly;

[E] this composite rotor assembly (6) as a means for the transportation and capacitive storage of electronic charge between opposite-polarity sections of the housing (5) and (3) (which are proximal to the inner and outer rotor circumferences respectively), such that a vastly higher secondary voltage is caused to appear across interposed neutral housing sections (4), resulting in a continuous ultra-high-energy DC discharge current about the housing externally which is also conducted internally across the rotor segments (14) that extend across the neutral housing portion and between the positive sections;

[F] a large number of stationary electromagnetic armatures (37) in a uniform circular arrangement located within the neutral electrical region (4) of the housing which are to be operated principally on variable DC voltage, but which may also accept limited pulsed unidirectional or alternating voltage input, and which are employed as a group to impart an orderly rotational magnetic vector moment to the external discharge current that acts to inhibit the formation of concentrated arc streamer or channel phenomena and thus to assist in rendering such current quasi-coherent in nature; and

[G] the said principal electrical generating or Primary Power System as operated and used in such a manner that a minor pulsed unidirectional or alternating voltage is superimposed upon the high-energy DC rotor current, and the external discharge current therefore acquires a discrete AC power factor, for purposes of modulating the electrodynamic characteristics of the external field during normal operation and/or for purposes of exploring the invention's potential signal communications capability in relation to intriguing new theories in high-energy quantum physics and relativity.

In a "single-stage" rotor electrical circuit embodiment of the Generator, as intended for use in an electrical and/or thermal energy output application, any such minor AC voltage present in said rotor circuit receives only a modest and single level of amplification—in a manner generally associated with a single multi-electrode vacuum tube. In a "three-stage" rotor electrical circuit embodiment of the Generator, as intended for use in a propulsive and/or communications application, any such minor AC voltage may receive a substantial and multiple level of amplification—in a manner generally associated with a multiple number of sequentially-coupled multi-electrode vacuum tubes.

Figure 2:
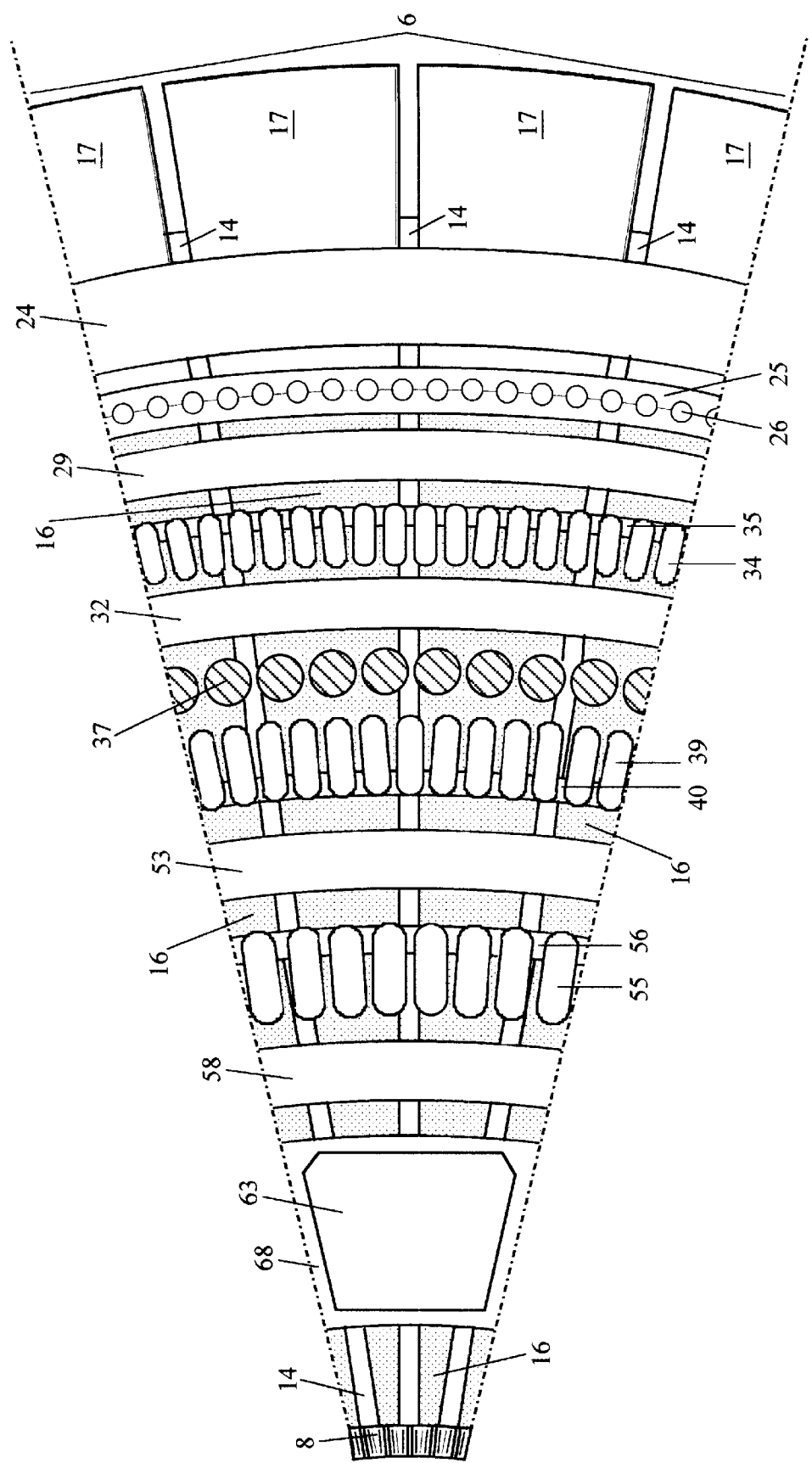
FIG. 2 shows a top sectional view of a 30° radial sector of that same working structure.
Figure 3:
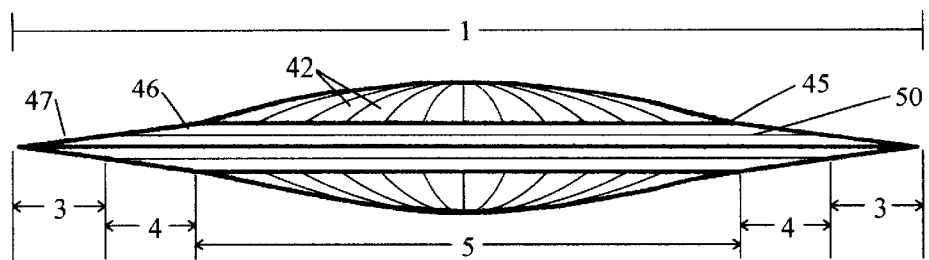
FIG. 3 shows a side view of the invention's symmetrical housing or hull configuration.
Figure 4:
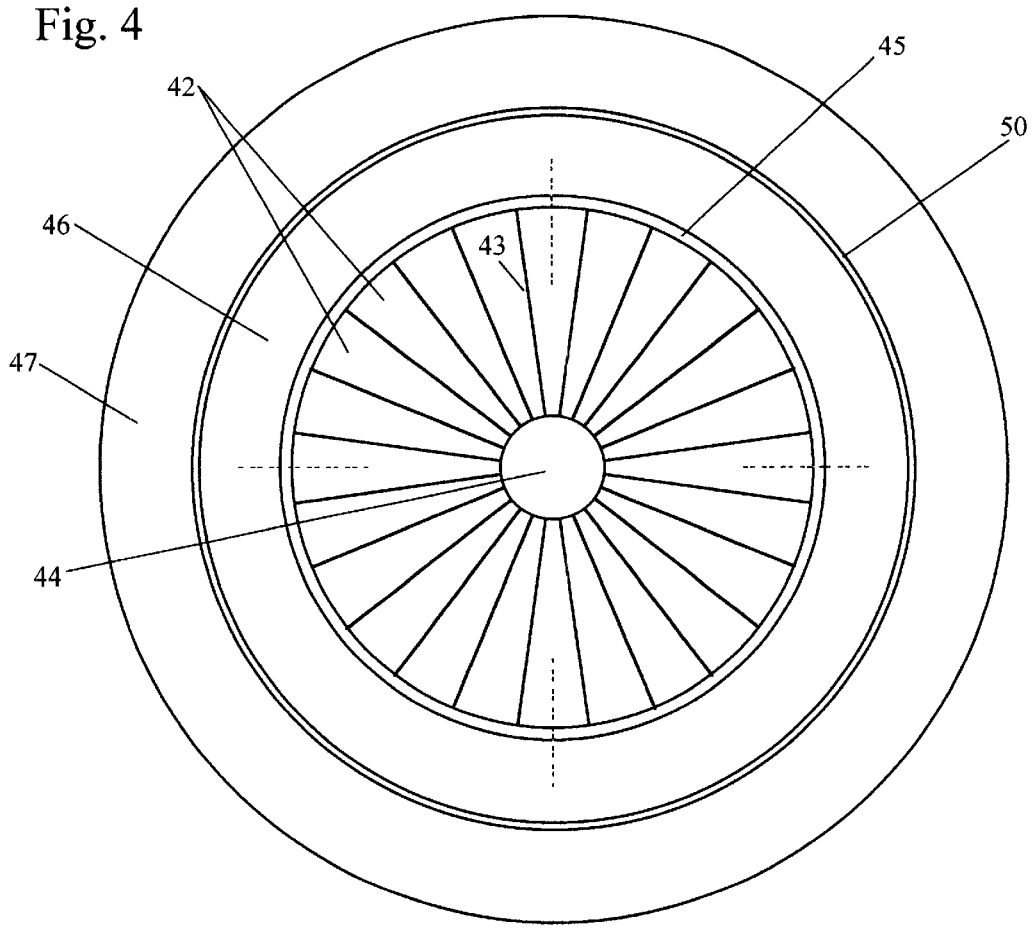
FIG. 4 shows a top view or bottom view of that same housing/hull configuration.

FIG. 1 shows a side sectional view of the general form of the invention, as if cut through the central axis of the circular structure. Only one side of the tapered peripheral portion of the structure is shown, the overall Generator being symmetrical about the axis along which the section shown is cut. FIG. 2 shows a top sectional view of the invention, as if cut through just above the rotor assembly at the "equator", with only about a 30° radial sector of the circular structure shown (the remaining 330° being identical around the Generator). In each case, identical reference numbers are used to indicate identical elements. FIGS. 3 and 4 are side and top or bottom views of the Generator (respectively), showing the outward appearance of the invention and the external field it produces. The following discussion of the general form of the invention will be in reference to FIGS. 1 to 4, unless otherwise noted.

The entire apparatus of the invention is contained within a circular conductive exterior hull or housing (1), which is tapered from its vertical centerline ("axis") to its rim (or "equator"). The overall housing is radially symmetrical around the axis, and bilaterally symmetrical about the equator. This housing's two central one-base spheric-zone-shaped sections (5) will be positively charged, its two intermediary conical ring-shaped sections (4) will be electrically neutral, and the convergent outermost or peripheral conical ring-shaped sections (3) will be negatively charged. Preferably, the surface areas of the outer (3) and inner (5) housing sections are equal, and specific details of the housing or hull design are given in a section to follow.

Each of the housing's two symmetrical positive sections (5), or hull positive "zones", should be divided into equal-area radial sectors (42) which are equal in number to the number of like sections into which the device's superstructure is divided. Thus, in the preferred embodiment of the Generator these two positive zones (5) will each be divided into 36 such sectors, and isolated top and bottom, yielding a total of 72 individually controllable discharge collector areas. The positive zone sectors (42) jointly comprise what may hereinafter be referred to as the device's "Field Hub", and should be composed of a conductive refractory metal or high-temperature structural alloy such as #310 stainless steel. These positive sectors are insulated from sector-to-sector by insulating "partitions" (43) of a suitable ceramic material (such as Cordierite), and must be supported by an insulating understructure (not shown).

At least one hull "neutral ring" surface layer (46) is also to be affixed on a housing frame and composed of one or more insulating ceramic material/s (such as Cordierite, Zirconia, and/or Kézite, as necessary). Said neutral hull layer/s may be applied in the form of plates and/or tiles to nonmetallic "deck" sheeting (not shown separately) supported by superstructure beams (153). This decking and its supporting beams are both preferably composed of a carbon composite material, and will thus be fairly conductive. Therefore, both must be isolated from the positive Field Hub by a dielectric buffer material (45) and from the hull's Emitter Ring (47), comprised of two negative housing sections (3), by an auxiliary dielectric buffer (50). The Generator's neutral housing section superstructure is shown in detail in FIG. 14, as is a piping system of coolant tubes or "thermal conduits" (74)–(79) for maintaining the hull neutral sections (4) and superstructure—as well as the enclosed Primary Power System—at an acceptable operating temperature. Such an intercooler system would utilize a cryogenic coolant such as liquid air or nitrogen when the EDF Generator is operated in the atmosphere for purposes of thermal energy output, and will be explained in greater detail in a section to follow.

The negative hull plates which form each section (3) of the Generator's peripheral Emitter Ring (47), to which the rotor (6) distributes the discharge current forming the exterior field envelope, should be composed of high-purity aluminum which is copper-clad and then nickel-plated to prevent erosion at high field voltage and current levels. The abutting edges of all of the adjacent such plates must be welded one to another, and affixed to any necessary neutral hull section hardware, such that a hard vacuum may be drawn within the peripheral chamber (11) thereby formed. The induction compartment (12) enclosed between the two neutral hull sections (4) is contiguous with the peripheral or space charge chamber (11), and thus is equally evacuated.

A pressurizable central chamber (2) within the housing (1), located between the two hull positive zones (5) thereof, constitutes the location of the Generator's control cabin and of its payload area when used as an aerospace vessel. The interior (11)–(12) of the negative (3) and neutral (4) housing sections (respectively) is separately sealed, and must be as highly evacuated as possible to promote the efficiency of the various rotating and stationary electrode arrays and to prevent their destructive failure. The main vacuum seals (155) and the rotor's vacuum chamber charge buffers (156) are shown in FIG. 1.

Inside the evacuated induction compartment (12) of the housing (1), and surrounding the central chamber (2), is located the composite rotor assembly (6) in the form of a flat annular flywheel. In the preferred embodiment, 180 individual conductors or segments (14) of very high collective ampacity are employed in the rotor, as will be seen in the discussion of FIG. 5 below, as are a like number of inter-segment insulators or segment "separators" (16). The preferred material for the rotor segments is high-purity copper which is certified oxygen-free, to resist the production of free oxygen radicals at high operating temperatures which would degrade the performance of the various electrode arrays and cause an undesirable increase in vacuum chamber (11) temperature.

The inner ends of the rotor segments (14) and segment separators (16) are mechanically connected via a retaining and lockdown section thereof to one or more ring gear(s) (8), which run/s entirely around the central aperture of the rotor assembly. Suitable insulating attachment hardware (7), as described in detail in the following section (and shown in FIG. 15), will be used to effect a rigid mechanical union of the segments and separators to the said ring gear(s) and associated drive means such that the gear(s) and all conductive components of such drive means are electrically isolated from the energized segments. The ring gear(s) (8) may be engaged by one or more pinion or drive gear/s (162) powered by a motor (9) or plurality thereof, which may be of various types (such as electrical or hydraulic), causing the rotor to rotate around the central chamber (2). The rotor is supported near its outer edge by two ballraces (25) mounted to the housing superstructure and to the rotor, and having bearing balls (26), allowing it to spin freely.

Figure 7:
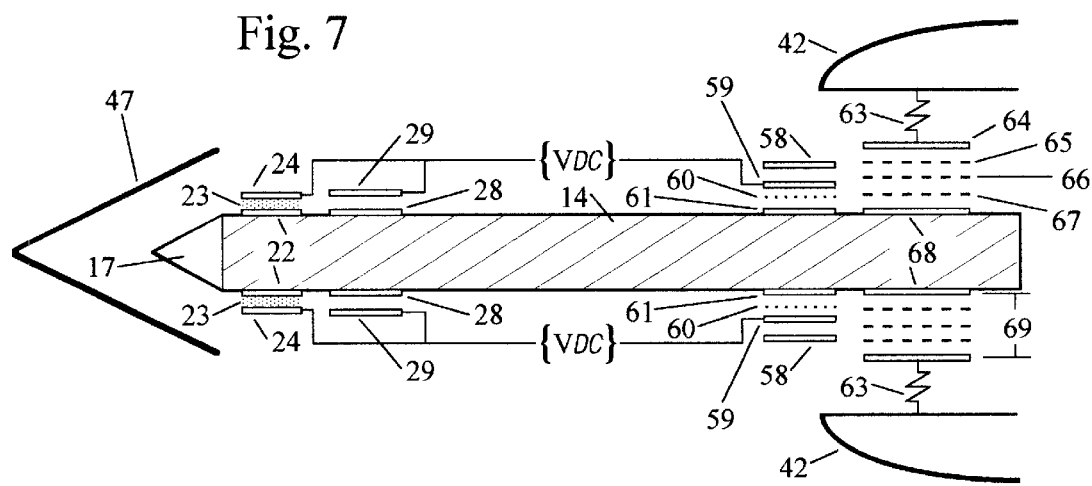
FIG. 7 shows a simplified schematic representation of the invention's two "primary induction ring" electrode arrays, in relation to the rotor electrical circuit.

As can be seen in either FIG. 1 or 7, the rotor segments (14) are electrically connected together at each end by continuous inner (68) and outer (22) electrode rings, and also at intermediate points by induction cathode rings (28) and induction anode rings (61). The inner electrode rings (68) constitute the primary induction ring array anode elements, as will be described below. The outer electrode rings (22) are each covered by a dielectric layer (23) which is in turn covered by an anode ring (24), and each combination of rings (22) and (24) separated by dielectric layer (23) forms a housing charge ballast capacitor whose function will be explained in detail below. Induction anode rings (29) and cathode rings (59) are used to electrostatically induce corresponding negative and positive voltages on rotor-mounted rings (28) and (61), respectively, thereby electrically energizing the rotor segments as will also be described in further detail below.

Figure 5:
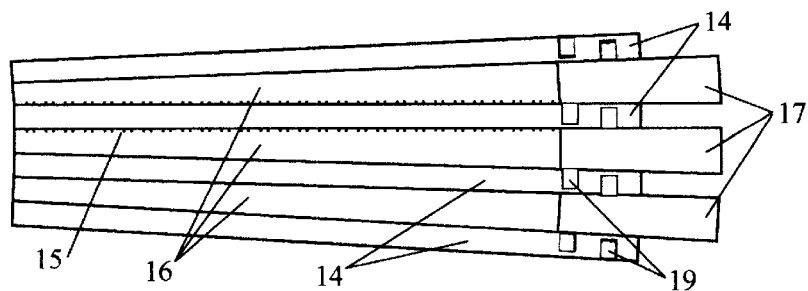
FIG. 5 depicts a small radial sector of the basic rotor assembly construction, in top view, details of the rotor segments, inter-segment insulators, and field emitters.

FIG. 5 shows details of the basic rotor construction. Wedge-shaped ceramic pieces or segment separators (16) equal in number to the conductive rotor segments (14) are to be positioned uniformly between the individual segments, as are the rotor's peripheral field emitters (17). To form the base rotor construction, the segments, separators, and field emitters must be equal in number, preferably using 180 of each. The said segment separators are actually more structural than insulative in purpose, and not only stiffen the entire rotor to prevent its distortion at elevated temperature and rotational speed but also provide a nonconductive base for mounting all other rotor assembly components. Each of the ceramic separators (16) is bonded to its adjacent segments (14) by refractory adhesive layers (15).

Two important criteria for selecting a ceramic segment separator material are that the compound chosen be readily machinable like steel and provide very high physical strength yet require no firing. These parameters limit the choice made almost to a solitary substance: magnesium silicate ($MgSiO_3$). When suitably formed, this material can be milled, drilled, and tapped like steel (using low-speed tungsten carbide tools) and approaches the physical strength of dry-pressed porcelain. It is ready for use directly after shaping and requires no kiln hardening.

This latter characteristic is very important as it is extremely difficult to produce fired ceramic pieces with the exacting dimensional control necessary in this case, and it eliminates the tendency of thicker fired pieces to develop micro-cracks which may potentially cause destructive failure of the component under high centrifugal loading. Surfacing can be done with abrasive paper or grinding wheels, and it is very important that this material be machined or worked perfectly dry as it is fairly porous and any lubricant used tends to significantly alter its dielectric properties. Magnesium silicate of this type is available from CeramTec NA as CeramTec designation AlSiMag 222, and will withstand constant working temperature of over 1300° C.

Figure 6A:
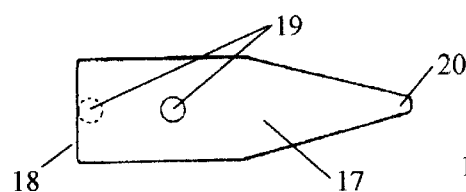
FIG. 6a and 6b show side and top views, respectively, of one of the invention's conductive rotor field emitters.
Figure 6B:
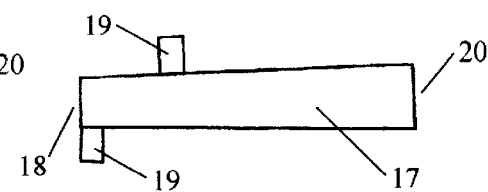

The insulating separators (16) are shorter than the conductive segments (14), allowing for the field emitters (17) to be fastened outboard of the separators. The field emitters are thus located around the outer circumference of the rotor assembly and should be formed of a sintered refractory composite, such as tungsten-copper, selected for its relative surface work function and superior arc-erosion characteristics. As can be seen in FIGS. 5, 6a, and 6b, the field emitters are fastened mechanically and electrically to the conductive segments (14) through locator pins (19), which fit into mating holes recessed into the ends of the segments. These emitters (17) taper to a somewhat rounded edge at the tips (20) which form the outermost periphery of the rotor (as an assembly), and are squared-off at their bases (18) to fit tightly against the insulating separators (16). From the top view of FIG. 6b, it can be seen that the field emitters follow the tapering of the segment separators (16), increasing slightly in width from their bases (18) to the tips (20). The conductive segments (14), in contrast, are of constant width over their length.

Overall Description of the Primary Power System Structure

Rotor Drive and Positioning Assemblies

Figure 15:
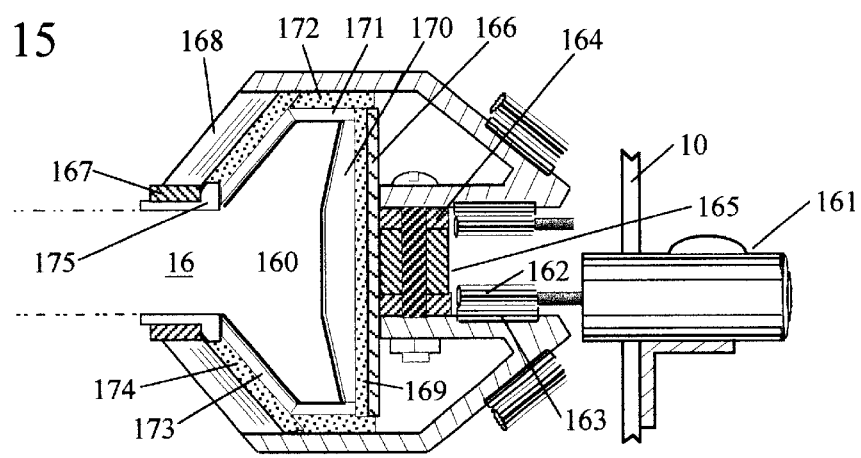
FIG. 15 shows a detail of an embodiment of the preferred central rotor segment attachment means and rotor drive assembly.

Referring now to FIG. 15, a split-frame centrifuge-style carrier assembly reminiscent of the rotatable mounting arrangement for the turntable of a carousel may be employed to firmly suspend, center, and rotatably mount the composite rotor assembly about its inner circumference within the evacuated induction compartment of the housing, and such carrier assembly should preferably be constructed of a weldable nonmagnetic metal alloy which is suitably insulated from the electrically energized rotor assembly components.

The rotatable carrier assembly may be mechanically-affixed and/or welded to one or more large metal ring gear(s) which may be comprised of like sections (163) to facilitate construction and which in turn may be supported, driven, and dynamically braked by one or more low-voltage DC motor-generator unit(s) (161) (similar to those used in large electric trains) and drive pinion gear/s (162). Such ring gear(s) may additionally be supported by pinion gear and pillow block bearing assemblies (if necessary—not shown in FIG. 15). Such drive motor-generators(s) (161) and said pillow block bearing assemblies (if any) must be separately and nonrotatably affixed to the relatively stationary housing superstructure.

Referring still to FIG. 15, it can be seen that in the preferred embodiment the inner end of each rotor segment (14) and segment separator (16) is flared outward into a retaining "fantail" (160). These retaining fantails are preferably enclosed and prepared for connection into a driven assembly using a system of: [i] insulating inner (171) and outer (173) ceramic thermal spacers; [ii] axial (172) and radial (174) nylon (or equivalent) load buffers; and [iii] insulating displacement (170) and lockdown (175) ceramic bushings. The retaining fantails are then secured into a driven assembly by two identical carrier half-structures comprising frame struts and members (168) and retaining ring sections (167), using: [i] mounting ring sections (164) each having two ring gear sections (163) attached thereto;

[ii] a corresponding number of mounting ring spacers (165) each having a very stiff metallic flexor plate (166) attached thereto; and [iii] nylon (or equivalent) torsion buffers (169). The drive pinion gears (162) allow a preferred total of 32 like and evenly-spaced DC drive motor-generator units (161), which are mounted to the Generator's ground frame (10), to apply input rotational torque (or counter-rotational braking torque) to the composite rotor assembly by engaging a total of four ring gears (comprised of sections (163)) which are mounted to the rotor's described drive carrier assembly.

Rolling bearing assemblies should be employed to further center and stabilize the composite rotor about its outer periphery within the evacuated induction compartment of the housing, as a readily feasible mechanical alternative for that purpose to 'zero-friction' electromagnetic positioning systems (of the type normally associated with mag-lev train technology) which are of a much greater complexity.

Such rolling bearing assemblies may comprise two complimentary pairs of stationary and rotating circular-groove raceways (25) about the outer periphery of the composite rotor assembly, as well as an appropriate number of bearing balls (26) including uniform ball separation means, and these bearing assemblies may be composed of nonmagnetic stainless steel and/or a specialized ball bearing ceramic (such as silicon nitride ($Si_3N_4$)) which may run unlubricated in a very hot electrically-charged environment

The Rotor and Associated Elements

There are a number of electrical structures attached to the base rotor construction, which rotate with the segments, separators, and field emitters as a composite assembly. It will be understood that the structures mounted on the rotor and those interacting with the rotor are symmetrical above and below the incorporating device's equator, as well as either continuous or repeating in placement around the device in the plane of the rotor segments, so that a reference to an element at one point above the rotor also applies to the similar elements below and around the rotor.

Figure 9:
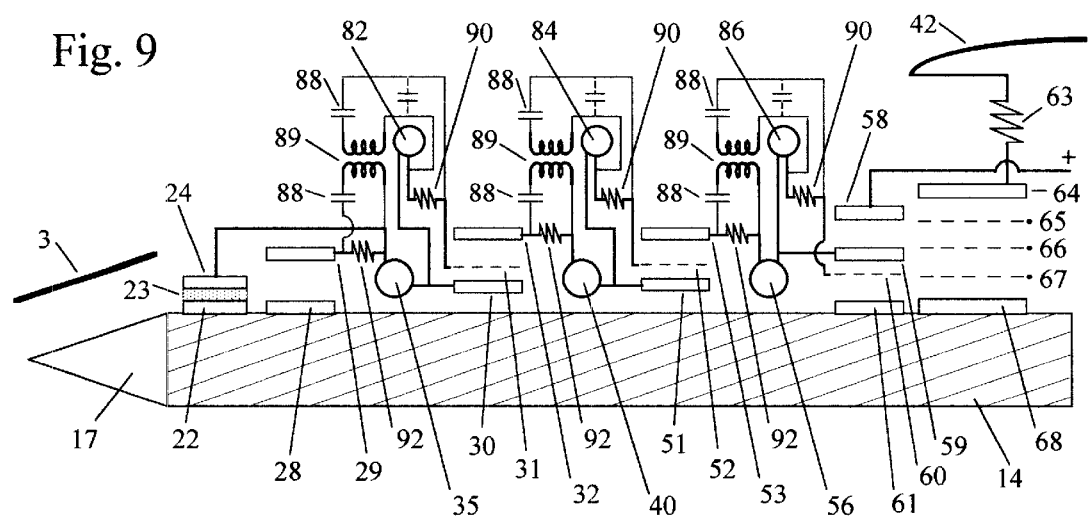
FIG. 9 shows a schematic of one symmetrical half of that same primary power system circuit, in a "three-stage" rotor construction embodiment.

Referring to FIGS. 1 and 2, and in the preferred three-stage embodiment of the invention suitable for an aerospace vessel (as shown schematically in FIG. 9), the following elements of the principal electrical generating means are mounted upon the annular rotor. Generally starting at the outer circumference of the rotor and working inward, and, for each structure, starting at the rotor and working upward, these are:

[a] the ballast capacitor, comprising a negative ring element (22) attached directly to the rotor, a dielectric layer (23) affixed thereto, and a positive ring element (24);

[b] the bearing ballrace (25), within which the bearing balls (26) roll between two identical raceway halves—one on the rotor, and one mounted to the vessel's stationary structural frame. The ballrace (25) and bearing balls (26) support the rotor peripherally and are structurally mechanical, not taking part in the electrical operation of the invention;

[c] the voltage-induction diode ring array, in the form of a cathode ring (28) which is mounted on and electrically connected to the rotor segments (14) and an anode ring (29) which is affixed plane-parallel to the cathode ring (28) and insulated from it by a suitable supporting structure using insulating posts, pins, or brackets in or on the segment separators (16). Although the resulting combination could be thought of as a 2-element or diode vacuum-tube construct and is similarly named, it is more accurately a "cold" parallel plate capacitor of high value and appreciable AC conductance which preferably exhibits a modest circuit DC leakage current;

[d] the outer field coil (35), helically wound and supported upon a continuous coil support or structural core which is preferably nonferromagnetic (not shown). There are preferably two windings on the core which together comprise such coil, as will be discussed in the circuit section below and as is shown in FIG. 9—the major portion or field winding (81), and a minor portion or bias winding (82);

[e] the outer voltage-transfer triode ring array, in the form of cathode (30), control grid element (31), and anode (32) rings or elements, affixed plane-parallel or radially-concentric above the rotor segments (14) and insulated from them and from each other by similar such supporting structure (using insulating posts, pins, or brackets) in or on the segment separators (16). This combination also comprises a triode vacuum-tube construct with controllably variable AC conductance;

[f] the center field coil (40), helically wound and supported upon a continuous coil support or core of the type described. There are again two windings on the core, as will be discussed in the circuit section below (and as is shown in FIG. 9)—the major portion or field winding (83), and a minor portion or bias winding (84);

[g] the inner voltage-transfer triode ring array, in the form of cathode (51), control grid element (52), and anode (53) rings or elements, affixed plane-parallel or radially concentric above the segments and insulated from them and from each other by the described supporting structure(s). This combination again comprises a triode vacuum-tube construct with controllably variable AC conductance;

[h] the inner field coil (56), helically wound and supported upon such continuous coil support or core. There are once again two windings on the core, as will be discussed in the circuit section below and as is shown in FIG. 9—the major portion or field winding (85), and a minor portion or bias winding (86);

[i] the voltage-induction triode ring array, in the form of an anode ring (61) which is mounted on and electrically connected to the rotor segments (14) as well as a cathode ring (59) and control grid element ring (60) affixed plane-parallel to the anode ring (61) and insulated from it and from each other by the said supporting structure(s). The resulting combination comprises a triode vacuum-tube construct with controllably variable AC conductance;

[j] the primary induction anode ring (68), which is also mounted on and electrically connected to the rotor segments (14) and which provides the positive element of the stationary plane-parallel electrode systems used to induce the exterior field; and

[k] the ring gear(s) (8) or other appropriate means for allowing a drive mechanism to spin the rotor.

Field Coils

Referring now to FIG. 1, the field coils (35)(40)(56) which comprise the major rotating portion of the primary DC voltage generating means are formed of conductive insulated magnet wire multi-layer toroidally wound upon cores (not shown) whose permeability should generally be minimized, and main portions of the DC voltage outputs of the three field coils comprising each of two like groups thereof—one above the plane of the rotor and one below—are sequentially connected via a plurality of individual systems of rotating plane-parallel electrode rings (or alternatively, modular radial electrode element systems or tubes) in the preferred three-stage rotor emodiment of the invention shown. The number of wire turns comprising each such field coil should in general be maximized (in a practical manner), in either the single- or three-stage embodiments.

Figure 8:
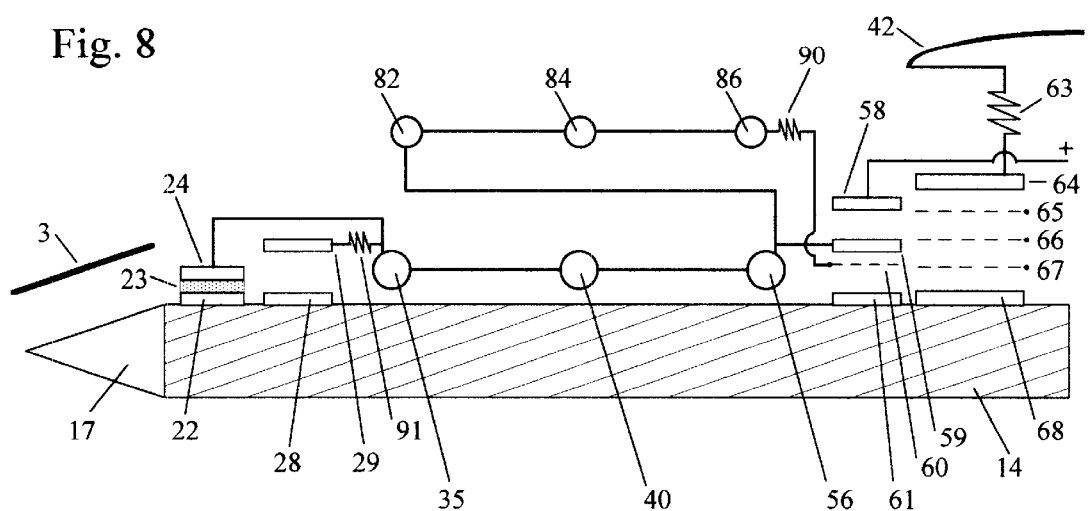
FIG. 8 shows a schematic of one symmetrical half of the primary power system circuit of the invention, in a "single-stage" rotor construction embodiment.

As is depicted more clearly in FIG. 8, each such field coil may be compound wound or comprise two or more independent voltage generating portions, with either all or the major portion of each coil constituting the field winding (81)(83) or (85) or principal DC voltage generating portion of that coil as a whole, and the principal or field winding portions of the field coils comprising either of the said two like groups thereof may be hooked in series one to another by direct physical connection in the single-stage rotor embodiment of the Generator shown. Each of the two like sets of three such field windings thus formed are then connected on their respective sides of the rotor between the plate resistor (91) of the diode array anode ring (29) and the inner triode array cathode ring (59), while observing appropriate conventions of polarity assignment.

The remaining minor portion (if any) of each field coil may comprise one or more independent bias and/or control winding(s), or secondary DC voltage generating portion(s) of that coil as a whole, with the largest such secondary winding if any constituting the control grid bias winding of that coil. As shown in FIGS. 8 and 9, one such bias winding (82)(84) or (86) is provided for each field coil and is positioned in the schematic(s) immediately thereabove. In the single-stage rotor embodiment of FIG. 8, these bias windings are also directly connected in series one to another between the inner triode array cathode ring (59) and the corresponding grid resistor (90) of that same array's control grid (60), with the negative end of each bias winding toward the said grid resistor.

In the three-stage embodiment of FIG. 9, the field winding of each said field coil is connected in series between the plate resistor (92) attached to the anode ring of the outer-lying electrode system which is adjacent to that coil and the cathode ring of the innerlying electrode system adjacent thereto, while observing appropriate conventions of polarity assignment. The bias winding (if any) of each said field coil is then connected between the cathode element (30)(51) or (59) of such innerlying electrode system and the grid resistor (90) attached to the negative control grid (31)(52) or (60) (respectively) of that same electrode system, while observing appropriate conventions of polarity assignment, such that said bias winding is in parallel with the cathode ring or element of that electrode system and may therefore provide an AC and/or DC voltage bias with respect thereto in the manner associated with electron vacuum tubes.

Rotating Electrode Arrays

Electron vacuum tube design, construction, and operating methods are employed to impress the principal portion of each field coil group's combined series DC voltage output across the Generator's rotor in an opposed parallel arrangement (comprising two like field winding circuits or rotor subcircuits), such that the rotor segments become electrically polarized, although the rotor is not considered uniformly energized electrically until a finite DC Primary Power System circuit current is established against the series capacitance and high bias voltage of the several rotor-mounted electrode systems.

Two special pairs of highly-capacitive electrode rings (22)(24) seperated by a dielectric media (23) are affixed upon the polarized rotor (6) near the outer negative periphery thereof, and supplied with a portion of the Generator's positive primary DC output voltage, in order to accomplish the storage of a predetermined amount of ballast electron charge which is sufficient to enable a desired much-higher secondary voltage to appear across the neutral sections of the housing (given the static capacitance and surface charge density characteristics of the housing as a whole in operation).

Electron vacuum tube design, construction, and operating methods may be employed to induce and/or modulate a substantial DC bias upon the plate currents of any or all of the various rotating plane-parallel and/or radial electrode systems or "arrays" employed in the present invention. Each rotating three-electrode system or triode array so-employed should be constructed in such a manner that it exhibits a minimum design amplification factor ($\mu$) equal to 4.0, with reference to any AC voltage or signal present in its electrical circuit and as a function of its engineered relative electrode spacing(s).

Electron vacuum tube design, construction, and operating methods may furthermore be employed to induce, modulate, and/or amplify a minor pulsed unidirectional or alternating voltage upon the high-energy DC rotor current, and therefore on the field envelope current as well, as a means by which the electrodynamic field produced by the Generator may potentially be used (as a form of antenna) for purposes of transmitting and receiving a variable electromagnetic and/or gravimetric resonant frequency signal either to or from itself or a separate similar device (as the case may be).

In light of this teaching, it is contemplated that one possible type of communications signal which might be investigated employing the EDF Generator would couple the electric, magnetic, and gravitic forces to utilize the wave mechanics of quantum potential vacuum fluctuations ($\Delta E_q$/$\Delta t$), which are believed by some theoretical physicists to propagate at $c^2$ in order to explain the uniform operation of gravity and entropy in two space-time continuums which are coincident but completely out-of-phase. Should this quantum gravity theory prove correct, the transmission delay of a gravimetrically-coupled EM signal at this wave speed would be only 0.10525 seconds per light-year.

In any event, it should be noted that the rotor interstage coupling transformers (89) which are depicted in FIGS. 1 and 9 (but are not shown in FIG. 2) would be employed only in a preferred three-stage rotor embodiment, and mounted (one each) immediately above the rotating diode and transfer triode arrays ((28)–(29), (30)–(32), and (51)–(53) respectively). These transformers may preferentially take the form of continuous toroid coils on either powdered iron or nonmagnetic cores (like the field coils), having single-layer primary and secondary windings, or of one or more pairs of balanced toroidal arc-section coils and cores of similar composition which are uniformly distributed above said rotating arrays. Each transformer (89) uses two DC blocking capacitors (88).

It may be appreciated from FIGS. 8 and 9 that each bias winding or series group thereof, its associated triode array, and a corresponding output plate resistor (91) or (92) together comprise one stage of amplification of any AC signal voltage which may be present across that triode's grid resistor (90) as an input. In this way, electromagnetic waves of one form or another from outside the external field created by the Generator may be both detected, from their influence on the waveform(s) of the field envelope current, and amplified from within the device (when used as an aerospace vessel).

The Interaction of the Rotor and Frame-mounted Elements

Magnetic Rings

A plurality of circular arrays of stationary permanent magnets essentially comprise the stationary portion of the primary DC voltage generating means, and each such magnet is preferably to be formed as a C-shaped ring composed of axially round stock of a metallic ferromagnetic substance which exhibits a very high residual induction (such as the alloy family commonly known as Alnico). The number of individual magnetic rings comprising each such array should in general be maximized (in a practical manner). Preferably, each magnet array has a rigid and annular nonmagnetic round core (not shown) which is roughly equal in minor diameter to the inside diameter of the constituent rings, such that the rings may be easily strung thereupon rather like beads on an abacus wire.

Referring once again to FIGS. 1 and 2, each of the several magnetic ring arrays (34)(39)(55) may be installed in sections which are preferably equal in number to the number of like sections into which the incorporating device's superstructure is divided. The rotating field coil (35)(40) or (56) associated with each such circular array of individual magnetic rings must be respectively concentric and adjacent thereto, and is basically positioned on both the radial and axial centerlines of the flux gaps of that array's constituent rings. As power is generated thereby, these rings may need periodic replacing.

The maximum length of the flux gap of each such C-shaped magnetic ring must of course be just slightly larger than the minor outside diameter of its associated field coil, and should be roughly equal to or just slightly less than the formed inside diameter of that magnetic ring. In the preferred embodiment these ring flux gaps are oriented horizontally, although they may also be readily oriented vertically if so desired. Each magnetic ring may also be mounted within the superstructure of the housing such that a comparatively small thin axially-polarized wafer of a highly-coercive permanent ferromagnetic substance (like sintered Ferrite 5 ($BaO.6Fe_2O_3$)) is positioned in the hollow center of that ring magnet, with such wafer's magnetic poles facing the like poles thereof, so as to act as a leakage flux blocking or reducing mechanism with respect thereto. These optional components would be most easily installed by insertion into a corresponding slot cut into each of the described mounting cores, and are recommended for use in very large devices.

Also arranged concentrically around the evacuated induction compartment (12) of the Generator, but fixedly mounted within the vessel's structure instead of rotating with the rotor assembly, are the following elements of the principal electrical generating means. Again, they are discussed in order from the outer circumference of the vessel inward, as shown in FIGS. 1 and 2, and a reference to an element at one point above the rotor also applies to the similar elements below and around the rotor:

[a] the stationary half of the ballrace (25);

[b] the outer array (34) of stationary permanent magnets, which should be mounted on a nonmagnetic core and in the preferred embodiment incorporates a maximum of 900 such ring magnets equally spaced around the vessel superstructure;

[c] the circular group of stationary electromagnetic armatures (37) or "variable inductor" array, as used to impart a rotational magnetic force upon both the external discharge current and the internal rotor assembly (which is proximal thereto). Each such array preferably comprises a maximum of 180 such armatures, and is to be approximately centered within the neutral region of the housing so that its constituent armatures are axially parallel to the rotor's axis of rotation;

[d] the center array (39) of stationary permanent magnets, which should be mounted on a nonmagnetic core and in the preferred embodiment incorporates a maximum of 720 such ring magnets equally spaced around the vessel superstructure;

[e] the inner array of (55) stationary permanent magnets, which should be mounted on a nonmagnetic core and in the preferred embodiment incorporates a maximum of 576 such ring magnets equally spaced around the vessel superstructure; and

[f] the stationary anode ring (58), located adjacent and plane-parallel to the rotating cathode (59) of the inner electrostatic-induction triode array, which develops an induced positive voltage that is made available to the control circuitry shown in FIG. 10 as described below.

FIGS. 8 and 9 show two embodiments of the Primary Power System. The "Field Induction System" or stationary plane-parallel electrode arrangement(s) employed to induce the exterior field is/are basically the same in either case, and the voltage control system of FIG. 10 may be used with either embodiment.

The simpler single-stage rotor system of FIG. 8 is primarily intended for applications wherein the EDF Generator would be employed to produce useful electricity or heat, the latter being extracted from a principal liquid hull coolant circulated through the primary thermal conduits (48) (shown in FIG. 1) that encircle the field power resistors (63). Two thermal exchange or main service manifolds (not shown) would provide ground-based support to such a Generator from an associated utility or physical plant, as well as a remarkable level of electrical or thermal output from such Generator thereto. Each such manifold would connect directly to a single circular center sector of one of the two positive housing zones. Each of these two center sectors (44), one or either of which is depicted in FIG. 4, must in this case be composed of a nonconductive material.

Description of the Primary Power System Circuit

Referring again to FIG. 8, the respective outer, center, and inner field windings (81)(83)(85) are directly connected in series, and the voltage thus generated is applied to the inner induction triode array cathode ring (59) and (through plate resistor (91)) to the outer induction diode array anode ring (29) and to the ballast capacitor anode ring (24). The respective outer, center, and inner bias windings (82)(84)(86) are also connected in series, and the voltage thus generated is applied between the inner induction triode array cathode ring (59) and (through grid resistor (90)) to the control grid (60) of that same array. This places said control grid in parallel with that cathode electrically.

The turns numbers of the bias windings (82)(84)(86) and the grid resistor (90) values are chosen to apply a bias voltage to control grid (60) such that the inner induction triode array is biased very nearly to current cutoff. This results in a very high voltage being induced on the rotor segments (14) between outer induction cathode ring (28) and inner induction anode ring (61), but at a very low series field coil current due to the near-cutoff bias of the triode array. It is expected that the voltage on the rotor segments between these two rings, in a preferred embodiment using this arrangement, would be approximately 8,000 volts for a four-foot diameter prototype, or about 2,000 volts per foot of housing diameter. It is also anticipated that series field coil current could be limited to fractional amperage in smaller such devices and to single-digit amperage in the largest.

The preferred embodiment shown in FIG. 9 is a three-stage rotor system which is considered to be much more useful for applications wherein the EDF Generator may be employed as an aerospace vessel, in that it allows energy/wave-function signals from outside the vessel to be detected and amplified in the manner previously described.

In this embodiment, instead of the field windings (81)(83)(85) being directly connected together in series, intermediary voltage-transferring triode vacuum tube constructs are used to effect an indirect series connection between the said field windings. The voltage thus generated is again applied to the inner induction triode array cathode ring (59) and (through plate resistors (92)) to the outer induction diode array anode ring (29) and to the ballast capacitor anode ring (24). The bias windings (82)(84)(86) are in this case used to provide an independent bias voltage to the control grids (31)(52)(60) of the outer, center, and inner rotating triode arrays, respectively, in parallel with their cathodes.

As in the single-stage rotor embodiment described above, the turns numbers of the bias windings (82)(84)(86) and the grid resistor (90) values are chosen to apply a bias voltage to control grids (31)(52) and (60) respectively such that each corresponding triode array is biased very nearly to current cutoff. This results in a very high voltage being induced on the rotor segments (14) between outer induction cathode ring (28) and inner induction anode ring (61), again at a very low or fractional current due to the near-cutoff bias of the triode arrays. It is expected that the voltage on the rotor segments between these two rings, in a preferred embodiment using this arrangement, would be approximately 1,500 volts per foot of vessel diameter.

In general, the stationary anode rings (58) and all of the rotating electrode rings except the primary anode rings (68) should be composed of a nonmagnetic structural nickel alloy (such as Inconel 600). All rotating control grid element wires should be composed of an alloy such as that commonly known as nichrome. The rotating cathodes may be composed of modestly-thoriated tungsten, however, if and only as necessary to establish a small DC Primary Power System current if the observed 'dark discharge' current values are deemed insufficient, particularly in the three-stage embodiment wherein amplification of a minor AC signal voltage may be desired for communications purposes. The ceramic material Titania, with a nominal dielectric constant of 85, may preferably be used to form the posts, pins, or brackets which support the various rotating electrodes.

It is important to observe that both Primary Power System (rotor) field winding circuits as configured in both the single- and three-stage Generator embodiments will have an inherent AC series resonant frequency, and operation at that frequency will maximize the series field winding AC line currents (within given circuit resistor constraints) as well as the dependent stage plate voltage drops (across resistor(s) (91) or (92) respectively) which allow stage AC signal reproduction and amplification. As in traditional related practice, the series resonant frequency will be that at which the given circuit's inductive and capacitive reactances are approximately equal and opposite. Thus, the series resonant frequency of either of said Generator rotor circuit embodiments will be largely contingent upon the total field winding inductance and coil core permeability, as the various rotor electrode arrays and the plate resistor(s) (91) or (92) must have quite specific fixed relative design values of capacitance and resistance (respectively)—as a function of total field winding voltage—for proper overall DC and AC circuit performance.

Each Primary Power System control grid winding subcircuit as configured in the three-stage rotor embodiment may then be readily tuned for stage AC parallel resonance at the said inherent series resonant frequency, thereby minimizing stage grid subcircuit line current while maximizing the stage grid voltage drop (across each grid resistor (90)) which determines the level of net stage AC signal voltage gain or amplification obtained. As in traditional related practice, the parallel resonant frequency will once again be that at which the given subcircuit's inductive and capacitive reactances are approximately equal and opposite. This condition may be achieved by connecting an optional capacitor of suitable value if desired across the secondary winding (or control grid resistor side) of each rotor stage coupling transformer (89), as indicated in FIG. 9.

The Field Induction System

Before commencing a technical discussion of the stationary induction electrode systems which will be used to charge the positive housing sections, it will be necessary to further elucidate certain aspects of the Primary Power System electrical circuit so that a few of its key operational characteristics are more clearly understood.

Referring now to FIG. 7, each of the Generator's two identical groups of rotating field coils (one above and one below the rotor) are in essence connected in simple series across the rotor segments using pairs of capacitive electrode rings, thus forming a single series loop with respect to the rotor. The two such series loops are at the same time, however, connected in mutually-opposed electrostatic parallel with respect to the rotor segment circuit leg common to both such loops.

Based on applicable principles of proper circuit resolution and series DC capacitance, such an opposed series-parallel circuit may readily be configured such that equal and opposite-polarity voltages will result upon the rotor-mounted induction cathode (28) and anode (61) rings in the absence of a fixed ground reference. To this end, the rotor assembly itself is to remain completely without direct earth or chassis ground in operation, and a corresponding segment polarization will continue as the circuit is duly energized by a finite DC conduction current.

When a primary DC rotor current is also established to the housing's Emitter Ring (47) and an external discharge current in turn occurs to the positive zone sectors (42), the two systems of primary induction electrodes (64)–(68) also complete two simple series loops back to the rotor and the two such external field envelope subcircuits in parallel constitute the EDF Generator's "Field Induction System" circuit. Thus, the total field discharge current equals the primary rotor current, and the rotor segment circuit leg is common to both of the major system circuits described.

As is apparent from the section on Method of Operation, it is imperative that the charged housing sections also have no direct earth or chassis ground, being instead of a 'floating-ground' reference with respect to the described primary rotor circuit. The cathodes (64) of these two primary electrode systems may have a chassis ground reference at a very high resistive bias (as indicated in FIG. 10), across which any actual cathode charge imbalance or potential in operation may be detected and measured.

Therefore, in light of the Faraday shielding principle and the said equal and opposite voltages which occur at opposite ends of the rotor segments (14), the potential difference between the rotor field emitters (17) and the inner surfaces of the two negative hull sections (or Emitter Ring (47)) will tend to become equal (and opposite) in operation to that across the primary electrode systems. And thus, a suitably vast and engineered differential in the electron emissivity of the field emitters (17) and the said ground-referenced primary cathodes (64) will define the primary voltage expansion ratio which may be obtained (in the manner first outlined in the section on Method of Operation). This topic will be discussed in more detail in a section to follow.

Moreover, a basic field-envelope-circuit generator design is disclosed which thus far, in accordance with Faraday's and Lenz's Laws, can produce a very high DC primary voltage with minimized circuit AC current inductance losses. The Primary Power System's DC voltage is not readily available, however, for purposes of normally-usable electrical output. Brushless electrode rings (58) must once again be employed to extract any portion of this primary voltage for off-rotor use. The Primary Power System schematics shown in FIGS. 8 and 9 in conjunction with FIG. 10 best illustrate the use of these two additional stationary anode rings (58), one suspended adjacent to each inner rotor induction cathode ring (59), which allow a large electrostatically-induced positive DC voltage to be 'picked off'. This positive voltage may then be used as a source of low power within an external circuit, provided that circuit is negatively-grounded and only to the Generator's chassis, and is therefore really intended for auxiliary onboard usage only.

It can be seen thus far, and especially in FIG. 7, that there are essentially two major systems involved in creating the voltages which must be applied to the positive and negative housing or hull sections in order to form the electrodynamic field that will surround the Generator in operation. These two systems are:

[A] the Primary Power System, which generates a large DC voltage by electromagnetic induction and then electrostatically induces a major portion of that voltage upon the rotor segments (14) between two pairs of induction anode (61) and cathode (28) rings which are conductively affixed thereto (about the inner and outer circumferences of the rotor assembly, respectively); and

[B] the Field Induction System, which utilizes the potential difference which then exists between the positive inner circumference of the rotor—and its two attached primary anode rings (68)—and two separate sets of highly electron-emissive stationary cathodes (64) which are maintained at chassis ground and which are circularly-arranged near and electrically-connected to the periphery of each central collector housing section (or "zone") so that they may jointly charge their respective zone sectors (44) and/or (42) positively by stripping them of native electrons.

Each of these primary electrode array cathodes (64) connect directly to a field power resistor (63), which in turn connects to one positive radial zone sector (42) of the central housing sections. Each such cathode (64) is also vertically aligned inboard with a group of three stationary planeparallel grid electrode elements and one of the two innermost rotating induction anode rings (68) conductively-affixed to the rotor segments (14) (about their positive inner circumference). Each such group of three grid elements is comprised of a control grid (65), an accelerator grid (66), and a suppressor grid (67), with one such combined grid element assembly per radial zone sector (42).

Together with the said primary induction anode ring (68), each such 5-electrode group constitutes what is termed a "unit pentode array" ((69) as seen in FIG. 7). The unit pentode arrays (69) and their associated frame-mounted power resistors are thus arranged in two ring-shaped sets, located between the rotor and the two positive housing sections, which are referred to throughout as the "primary induction ring rays".

The potential difference between the unit pentode array cathodes (64) and rotor primary anode rings (68) is then referred to as the "primary array voltage", as the unit pentode arrays of each primary induction ring array are connected in parallel electrically (between the field envelope and rotor), and the number of unit pentode arrays should be equal to the number of like sections into which the Generator's superstructure is divided.

Electron vacuum tube design, construction, and operating methods may be employed to induce and/or modulate a substantial DC bias upon the plate current(s) of the several unit pentode arrays, which electrically link the polarized rotor to the central housing sections, for purposes of rendering the external electrodynamic field variably non-isometric and therefore directionally propulsive. Each such "stationary" 5-electrode system or unit pentode array (69) (whose anode element actually rotates) should be constructed in such a manner that it exhibits a minimum design amplification factor ($\mu$) equal to 12.0, again with reference to any AC voltage or signal present in the Field Induction System circuit and as a function of its engineered relative electrode spacing(s).

The rotating primary induction anode rings (68), stationary cathodes (64), and various grid element wires which are associated with the stationary multi-electrode systems should be composed of tungsten, due to the extremely heavy conduction current across these primary arrays. Ceramic posts, pins, or brackets composed of a specialized material such as Titania may once again be used to support all of the various stationary electrodes and grid elements, and each unit pentode array's grid wires should be vertically aligned (or mutually-shading) similarly to those in a "beam power pentode" vacuum tube.

As generally depicted in FIG. 1, a primary thermal conduit (48) with an imbedded coolant-carrying core (49) encircles and mechanically supports each unit pentode array, its power resistor (63), and that resistor's enclosing dielectric buffer (45). These thermal conduits and dielectric buffers will be examined in further detail hereinafter.

Figure 10:
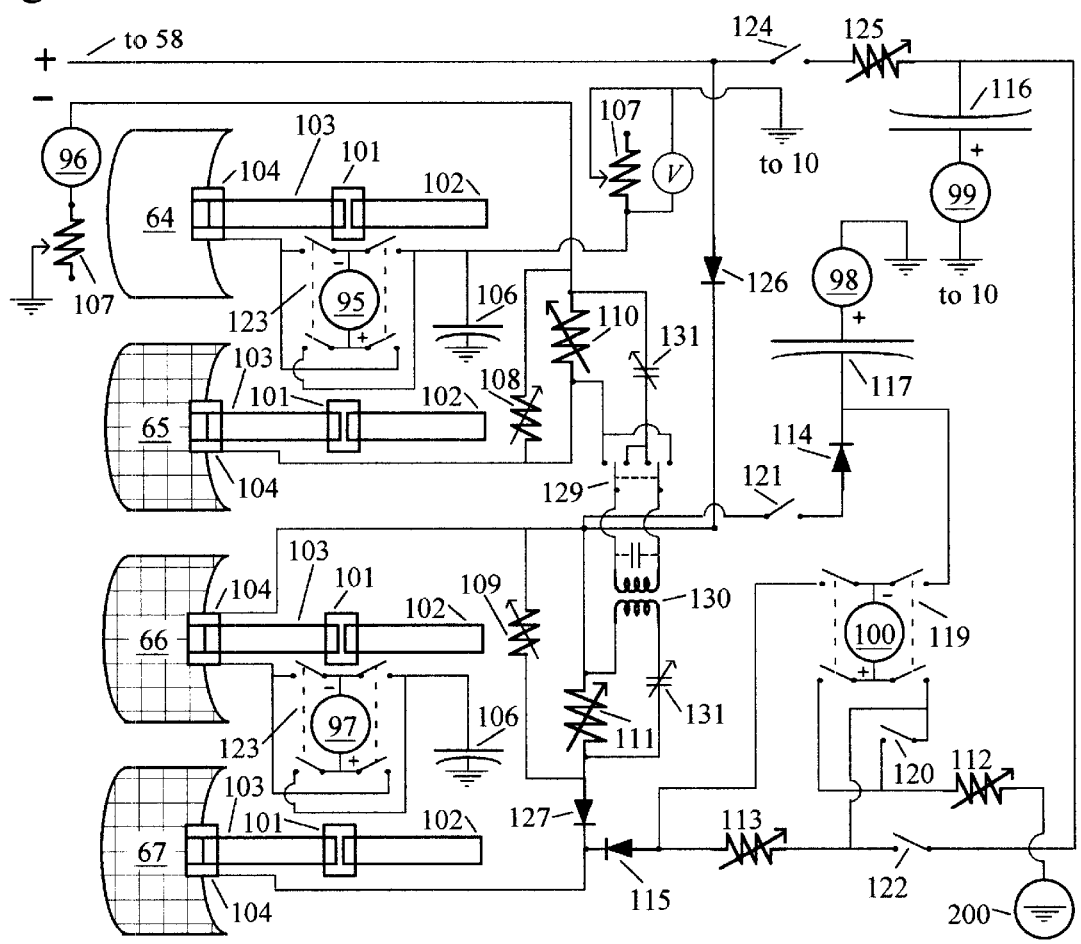
FIG. 10 shows a schematic of the field voltage control system circuit of the invention.

The operation of the Field Induction System is regulated by a central Field Voltage Control System which is modular in nature, as illustrated in FIG. 10, and which is therefore mechanically and electrically connected to the stationary cathodes and grid elements of each unit pentode array (69). In this regard, the auxiliary stationary anode rings (58) described above are to serve as the source of positive voltage applied to the accelerator grids (66) of said unit pentode arrays, and such Field Voltage Control System is designed to directly accept this voltage for that purpose. The Field Induction and Voltage Control Systems will be discussed further in sections to follow.

Zone Sector Construction

Referring now generally to FIGS. 3 and 4, one major goal in dividing each of the two hull positive zones or sections (5)

which jointly comprise the Generator's Field Hub into a large number of radial sectors (42) in electrical parallel is to limit the external field current reaching each particular power resistor and unit pentode array combination to a fairly uniform level, while somewhat reducing field current return eddy losses as well. However, each radial sector (42) is thereby also given the capability of effecting a local thrust production differential (in propulsive three-stage rotor devices), by virtue of its electrical isolation, as it is then possible to vary the local resistance presented to the electrodynamic field with respect to any given radial sector so that a substantial measure of navigational control in the z-axis may thus be achieved by varying the proportional field current conducted by that sector.

Because the inherent resistance of each such sector itself will be negligible even at an extremely elevated operating temperature, in part due to the very low temperature coefficient of resistivity of the proposed steel hull plate material, the voltage drop across the radial length of each sector will also be negligible. Thus, the determination of an appropriate sector thickness becomes an entirely structural consideration. A secondary design goal with respect to zone sectorization is therefore to select a uniform cross-sectional area for the radial zone sectors (42) which yields a Field Hub total conduction mass approaching that of the device's rotor segments (14).

The hull plating which forms each positive zone (or section (5)) of the Generator's Field Hub should preferably be composed of stainless steel or a refractory metal, and divided into thirty-six equal-area radial zone sectors (42) of truncated wedge shape and a circular center zone sector (44). As stated earlier, in the single-stage Generator embodiment these two center zone sectors must be of a nonconductive material or construction, and should also comprise approximately 4 to 5% of the total area of their respective zones to allow the connection of the exchange or main service manifolds described above. In the three-stage embodiment such center sectors (44) must instead be conductive as just prescribed for the radial zone sectors (42), and should each comprise about 1% of the said zone area. Each such positive radial sector should be formed of a single piece of the hull plating material in such a manner that its cross-sectional area in the direction of its radial length is maintained at a very uniform value.

The uniform thickness of each center zone sector (44) should be equal to that of the radial sectors as measured at the minor (inner) arc width thereof, and the radial sectors must be insulated from the respective center sector where they meet that center sector's periphery (except in single-stage rotor devices). A suitable thin ceramic insulating partition (43) may therefore be installed between each adjacent pair of radial zone sectors (42), and around each center sector (44) in three-stage devices, and the uniform flat thickness of these sector insulators should in general be minimized.

In three-stage devices, four radial sectors (42) of each positive housing zone which correspond to cardinal points separated by 90 degrees of the hull's circumference, and which divide the Field Hub into four equal quadrants (as indicated with phantom lines in FIG. 4), should be connected in parallel with the center sector of that positive zone at the maximum positive voltage end of those four sectors' respective power resistors (63).

The parallel resistance of the four conductors which therefore connect each center zone sector (44) (in three-stage devices) to its respective network of power resistors should then be such that that sector's per unit surface area level of field current conduction is slightly higher on the average than that of its adjacent radial sectors (42), under uniform zero-signal field bias conditions as hereinafter described.

The four unit pentode arrays (69) of each primary induction ring array which correspond to the power resistors so-connected to that primary array's center zone sector (44) would generally not be utilized individually in the active field current bias modulation related to the production of local thrust differentials (in three-stage rotor devices), being instead reserved primarily for potential involvement in signal communications transmission and/or reception activities.

Power Resistors

As best seen in FIG. 1, the cathode element (64) of each plane-parallel electrode system or unit pentode array which is used to link the rotor assembly with a positive housing collector section or radial zone sector (42) is electrically connected to such positive section or sector by means of a ceramic resistor block (63), of a certain low dielectric constant and high volume resistivity, which becomes a poor but effective conductor at the elevated operating voltage and temperature of such housing collector sections and which ensures an adequate external field current voltage drop between such section or sector (42) and said cathode element (64) (which is chassis-grounded as shown in FIG. 10).

Referring still to FIG. 1, each said ceramic resistor block or "power resistor" (63) is to be entirely jacketed by a hollow ceramic thermal conduit (48), including a dielectric buffer (45) composed of a ferroelectric material having a certain high dielectric constant and very high volume resistivity which does not become a conductor even at the elevated operating voltage and temperature levels of said power resistors. These thermal conduits (48) mechanically connect the power resistors to a flattened inner surface of such positive hull section or radial sector (42) and a form of very-high-temperature heat transfer fluid such as liquid sodium may be circulated therein so that the proper resistor temperature is maintained to ensure an optimum cathode potential with respect to ground.

A suitable manifolding, pump, and heat exchanger system (not shown) may be used to extract or transfer an extremely high level of recoverable thermal energy from the power resistors (63), arising from the field current voltage drop associated therewith, by means of such primary heat transfer fluid circulated through the thermal conduit cores (49) in the manner normally associated with nuclear power plants. Similarly, the rate at which such primary hull coolant is circulated may be used to directly regulate and limit the external field current to a value within the safe ampacity of the rotor assembly.

It is important to point out that each of the Generator's power resistors (63) and its associated dielectric buffer (45) and primary thermal conduit (48) may be designed, as an assembly, to incorporate a fixed positive reduced-voltage tap (not shown), whereby a main source of onboard or output DC or AC electrical power may be provided either for or from the Generator within a limited-duty circuit which is grounded directly to the primary cathodes. Provisions should and may also be provided for biasing, damping, and/or inductively coupling any primary conduit connecting sections, to control or harness electromotive currents induced in the highly-conductive primary coolant. Onboard electrical resistive heating means should and may be incorporated for purposes of pre-heating the primary coolant and, in turn, the power resistors and dielectric buffers.

Figure 11:
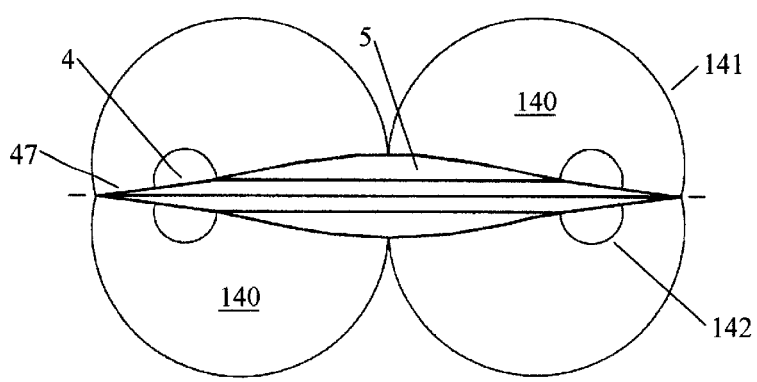
FIG. 11 shows a simplified diagram of the electrodynamic field "envelope" produced by the invention, around a side view of the invention's housing/hull.

Referring briefly to FIG. 11, it is also important to note that the Generator's power resistors must be in a conductive state before the housing potential difference reaches breakdown field intensity, as figured along a minimum semicircular arc trajectory (142) across the hull neutral sections (4), and the flow of field discharge current commences. Therefore, the actual maximum dielectric constant of the resistor material used in very-high-voltage single-stage rotor devices, and in ultra-high-voltage three-stage rotor devices as well, may be calculated at about k=11.

Figure 14:
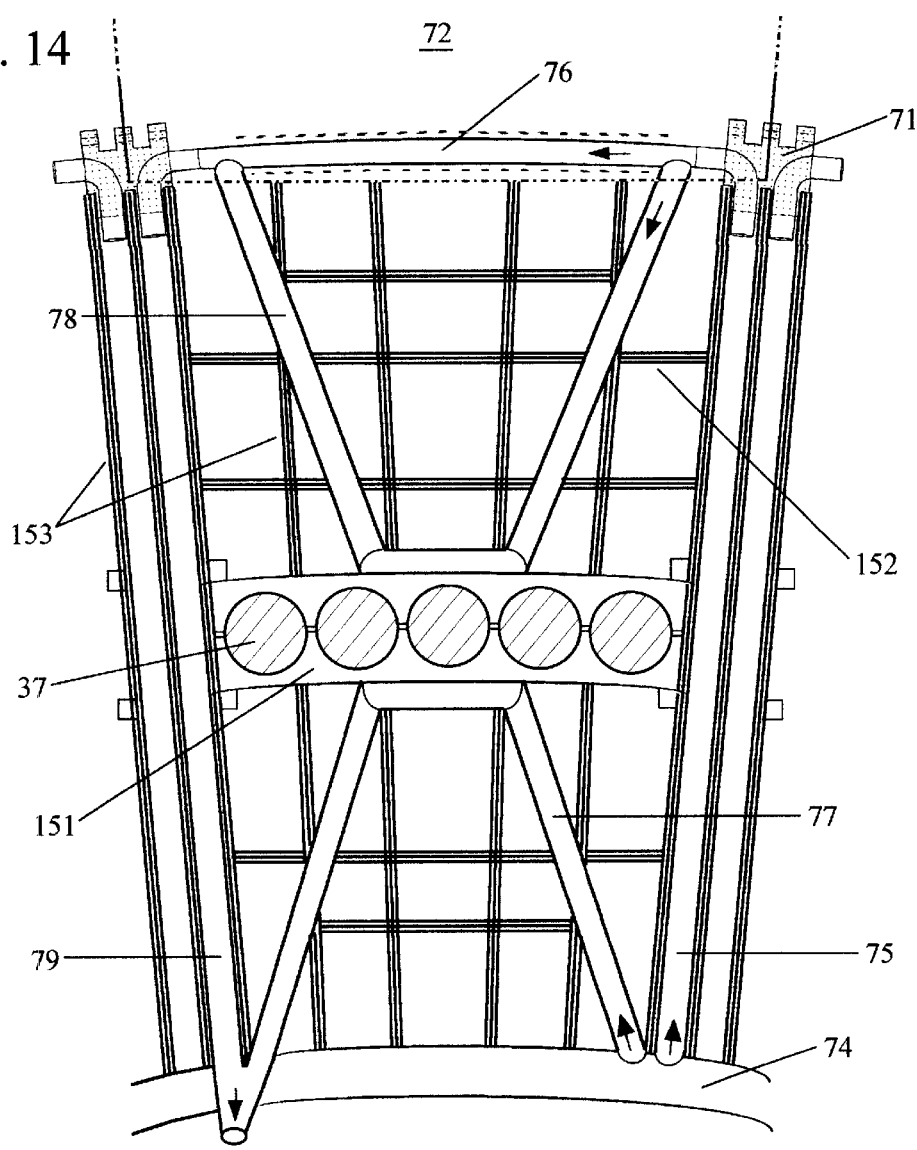
FIG. 14 shows a top or bottom view of a radial sector of the invention's neutral hull section, showing the housing cooling and/or heat transfer system arrangements.

As is best seen in FIG. 14, the recovery thermal conduits (79) of the secondary hull coolant system which assist in supporting the entire tapered peripheral portion of the housing must pass inboard between the power resistor assemblies referred to above, and therefore the resistors (63) must assume a complex tapered shape to provide the necessary clearance. As generally depicted in FIGS. 1 and 2, they will have a trapezoidal cross section at the 'top' or outward-facing end (with radial length somewhat greater than minor circumferential width) and a rectangular cross section at the bottom or cathode end (with circumferential width much greater than radial length). In this regard, their engineered shape should still maintain a uniform conduction cross section exactly analogous to that of the preferred positive zone sector construction described above.

Dielectric Buffers

Referring once again to FIG. 1, it is imperative to electrically insulate the power resistors (63)—due to the extreme voltage drop that will occur across them in operation—to prevent direct discharge to other nearby structural components from taking place. However, not only is this a problem due to the thickness of insulation which would be required at any 'ordinary' dielectric value, but the power resistors' projected operating temperature range of 600 to 700+° C. completely precludes the use of almost all known dielectrics. Fortunately, the search for high-temperature dielectrics for use in aerospace electronics applications (particularly multi-layer capacitors) has resulted in the development of a small number of exotic materials potentially suitable for use as a space charge buffer (156) or dielectric encapsulant (45) for the Generator's power resistors (63).

In the application contemplated herein, the volume resistivity of the resistor encapsulant is somewhat secondary to its dielectric constant k at high temperature, because no opposing contact voltage is present (as in a capacitor) to encourage circuit conduction losses within the material. Therefore, the prime consideration is the dielectric's ability to exhibit a very large k value at over 600° C. This places the material squarely in the realm of a very small select group of Class III high transition temperature ferroelectrics. These materials, such as Tantalum-modified Lanthanum Titanate and Lead Ytterbium Tantalate, do not begin to demonstrate significant dielectric strength at less than 300 to 450° C. One such compound, Sodium Bismuth Titanate ($Na_{0.5}Bi_{4.5}Ti_4O_{15}$), actually exhibits an amazing peak k value of about 3100 near the middle of the said power resistor operating temperature range: at 655° C. (1,202° F.). This would seem to indicate that this compound is eminently suited for use in forming the necessary rotor space charge buffer pieces (156) and/or resistor dielectric buffers (45) in this application.

It should be stressed that great care in quality control must be exercised in formulating and sintering this or any similar such special compound during manufacture of the dielectric buffer pieces. An absolute minimum of impurities must be assured, the density of the constituent powder maximized, and each piece finally certified as being free of the smallest physical defect prior to use in order to attain the desired operating performance. It is also hoped that these crucial components may each be compaction die formed and sintered simultaneously with a respective power resistor (63), and perhaps even with the corresponding primary thermal conduit (48) as well.

The core (49) of the thermal conduit associated with each power resistor (63) should be constructed of a refractory metal or alloy tubing (such as molybdenum) which is jacketed with high-purity Alumina or a comparable material formed directly thereupon. Thus, each such primary thermal conduit becomes an extremely strong structural member which may also be used to support the stationary electrodes of the corresponding unit pentode array, while circulating the preferred liquid sodium heat transfer fluid or coolant around the outward faces of that power resistor to recover or remove its excess heat.

Each power resistor (63), its dielectric buffer (45), and associated primary thermal conduit (48) together comprise one power resistor assembly, and each such assembly in combination with its corresponding unit pentode array is considered for present purposes as forming the constituent component group of which the primary induction ring arrays and Field Induction System are comprised.

Extensive calculations reveal that a suitable power resistor material in most sizes of the single-stage embodiment of the Generator would be a ceramic material with the chemical formula $Mgo.SiO_2$, which is available from CeramTec NA as CeramTec designation Steatite 357. A suitable power resistor material in most sizes of the preferred three-stage embodiment of the Generator would be a somewhat different ceramic material with the chemical formula $2MgO.2Al_2O_3.5SiO_2$, which is available from CeramTec NA as CeramTec designation Cordierite 547.

Overall Description of the Field Induction System Circuit

Before an overview of the EDF Generator's Field Induction System electrical circuit is presented, a somewhat comprehensive examination of the nature of the housing or hull configuration should be made, as in this application the hull itself is an active part of that circuit. Its electrostatic characteristics as a function of such configuration will therefore have a fundamental influence upon the nature of the external field envelope discharge current itself.

Hull Design

The derivation of the Generator's design hull configuration, as best seen in FIG. 3, comprises a long and complicated story. This should not be taken to imply that the final and rather exacting composite shape selected is the only one that 'works' properly. It merely reflects the preferred embodiment of the inventor's conceptualization of a fundamentally mechanical device which happens to entail both tremendous electrical complexity and inspiring aeronautical implications.

Should the proposed vessel eventually be used to explore the possibility of transcending the time/light barrier, extremely precise calculations regarding its spatial displacement and charge/mass ratio will no doubt become necessary. Therefore, one of the principal reasons for the chosen hull design is that the total vessel displacement may readily be calculated using traditional formulas from analytic geometry for the volumes of the two truncated right conic sections and two one-base spheric zones, and the volume of the remaining cylindrical central chamber region.

Using just these formulas, a vessel hull configuration has therefore been developed which may be linearly expanded (as a scalar function of the hull radius) to virtually any size with no significant loss of accuracy. The Table of Dimensions which follows and the attendant schematic hull diagram of FIG. 3, upon which all of the subsequent Detailed Calculations quoted are based, illustrates the application of this design technique to a theoretical vessel hull only 48" in diameter. It must be emphasized that the construction of an Electrodynamic Field Generator this small might not prove entirely practical in reality, due strictly to mechanical limitations, and the inventor believes this prototype model to be in fact the smallest such machine that could be built. This original hull size was deliberately selected, however, to encourage the development of the maximum possible accuracy with respect to contingent specifications for the relative size and positioning of the Generator's principal components, prior to the actual construction of larger machines.

The surface areas of the negative (3) and positive (5) hull sections are set equal to each other, and for two very important reasons: [i] to give the vessel hull a significant theoretical capacitance (despite its unusual geometry); and [ii] to render the two "driving" or discharge current portions of the field envelope uniform in cross section. Essential considerations which are related to these fundamental design criteria are best expressed in the following electrostatic formula for uniform field intensity in a DC capacitor which exhibits a continuous leakage current:

$$E^2 = V\sigma/d\epsilon_o,$$

where V=equilibrium potential difference in volts,
  σ=average surface charge density of one plate,
  d=plate separation in meters,
  $\epsilon_o$=universal electrostatic constant,
  and E=uniform field intensity in volts/meter.

This equation plays an important supporting role in the invention's Method of Operation, as previously discussed in that section above.

The volumes of the peripheral right conic sections of hull volume surrounding the Field Hub and and those of the one-base spheric zones comprising the Field Hub itself are also set equal in a preferred embodiment, as this criterion is postulated to promote both the structural integrity of the hull in any attempt to breach light speed (and establish a stable Kerr metric space warp about the vessel) as well as the gravimetric stability of the central chamber/cabin area in light of the relativistic mass effects involved while doing so.

As the case may be, to achieve this equal-area/equal-volume design, it was found necessary to employ two crucial interrelated constants (in addition to the ratio ⅕ used to radially "step off" the hull's interior space): the Hull Area Constant and the Polar Hull Constant. The Area Constant is (as the name implies) necessary to achieve the equal-area part of the overall design solution, and merely dictates the small deviation of the neutral (4) and negative (3) housing sections' ring radii from the stated preferred design increment of the hull's radial width.

The other requisite design factor, the Polar Hull Constant, is much more complex in nature. This value specifies the maximum height of the spheric hull zones (5) as a function of their arc-shape, and the corresponding contingent Polar Volume Differential is absolutely essential to achieving the equal-volume aspect of the preferred design. It is important to note that certain allowances must be made in practice for a finite but electrically-significant peripheral edge 'thickness' (and therefore surface area) at the equator of the device's negative housing Emitter Ring (47), but will in general only minimally modify the "pure" design-model values obtained using the mathematical formulas given in the Table of Dimensions to follow.

Hull Configuration

Referring now to FIGS. 3 and 4, the exterior housing or hull (1) is designed specifically to have a circular disc shape the thickness of which along the vertical axis of symmetry (that also constitutes the rotor's axis of rotation) is relatively minor as compared to the diameter along its radial centerline plane, and which tapers gently from a maximum thickness along such vertical centerline to a very minor thickness at the radial periphery (47) of the housing.

The tapered disc shape of the hull is postulated to promote the formation and maintenance of a stable bihemitoroidal corona or arc discharge field based upon certain empirical principles of electrostatics and upon laboratory experiments performed by the inventor involving concentric circular electrodes. Such an electrodynamic field may be characterized electrostatically in this application by an axial positive polar electric field contiguous with a biplanar negative electric field, with each field of one given polarity tending strongly to become oriented parallel to a field of opposite respective polarity but similar intensity.

The exterior housing or hull (1) is therefore divided into two axially-central positive electron collector sections (5), as well as: [i] either a single radially-peripheral negative electron emitter ring (47) which is biplanar in cross section or two or more such ring sections (3) which are uniplanar in cross section having separate planar orientations; and [ii] two dielectric neutral sections (4) which are interposed between said positive and negative sections such that each such section of a given polarity is spatially separated from each section of the opposite respective polarity.

The total external surface area of the housing's negative Emitter Ring (47) or sections (3) is essentially equal to that of the positive collector housing sections (5) or zones, such that the overall housing configuration thereby acquires a significant theoretical static capacitance by design as intended. An estimated base value for such hull capacitance 'C' may be obtained by applying the surface area 'A' of the hull's two sets of "plates", as figured using the formulas in the Table of Dimensions below, to the standard formula for parallel-plate capacitance (C=$\epsilon_o$A/d). When plate separation 'd' is taken to be the simple average of the longest (141) and shortest (142) purely-semicircular arc current trajectories across the hull, as depicted in FIG. 11, this estimate of hull capacitance is approximately 13 to 14 mmf for an EDF Generator 48" in diameter.

Field Composition

Referring to FIG. 11, the external discharge current once initiated may be expanded as a function of the operative field voltage to fill two hemitoroidal spatial volumes of rotation (140) whose outer perimeters (141) are defined by a semicircular electron arc trajectory across the full housing radius in a plane perpendicular to the housing surface, or from the outermost point on the negative periphery thereof to the respective positive centerpoint of the housing lying on the vertical centerline thereof, and whose inner boundaries (142) are defined by a similar such trajectory across the hull's neutral ring or sections (4) from any innermost point on the negative periphery to the closest point thereto lying on the respective positive collector section (5).

The physical volume (140) of the external discharge current as described has a uniform cross-sectional area in the radial direction of electron conduction which corresponds to any such semicircular arc trajectories between points on the housing's negative Emitter Ring (47) and the respective positive collector housing sections (5) and therefore, by the definition of a conductor, such discharge current must assume a uniform current density. While very difficult to effectively describe in verbal terms, the idealized mathematical configuration of the Generator's heat- and thrust-producing field envelope region (as a function of its housing geometry) is visually easy to grasp and is clearly illustrated in FIG. 11.

Figure 12:
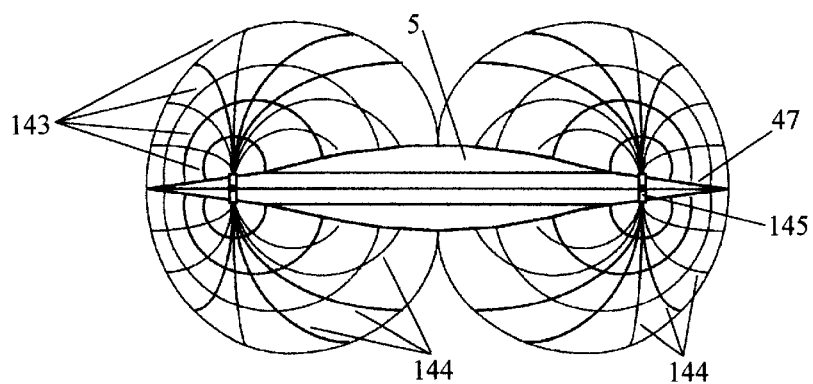
FIG. 12 shows the diagram of FIG. 11, with the addition of lines indicating the electric and magnetic field vectors comprising that same electrodynamic field envelope.
Figure 13:
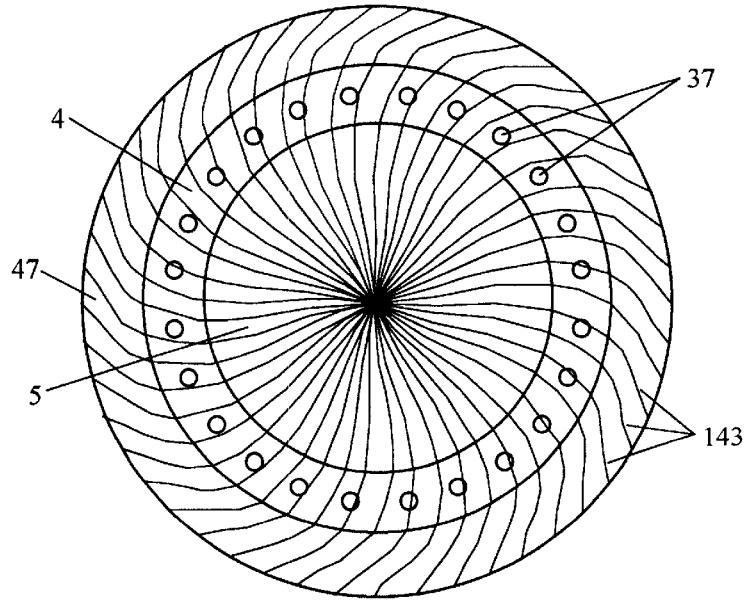
FIG. 13 shows a top or bottom view corresponding to the side view of FIG. 12.

As indicated in FIGS. 12 and 13, stationary electromagnetic armatures (37) are uniformly distributed into two circular arrays (145) containing equal numbers thereof which are positioned on opposite sides of the rotor from one another, and which are each located concentric to the rotor's axis of rotation midway between the negative Emitter Ring (47) and positive housing sections (5). These armature arrays (145) may be employed as two separate groups to impart a holistic but attenuating rotational magnetic vector moment upon the external discharge current, reaching through the thin neutral sections (4) of the housing, and thus may be used to modulate the field envelope's kinetic and electrical characteristics in a variety of ways useful to the invention and its objects.

FIGS. 12 and 13 also show the electric field vectors (143) as described above, and magnetic field vectors (144) as produced and modulated by the armatures (37) comprising the two armature or variable inductor arrays (145). FIG. 13 specifically depicts the regular lateral bending or displacement of the radially-impinging electron trajectories (143), under the influence of the inductor arrays (145), which is postulated to have a unitizing effect on the driving portions (140) of the field envelope.

It can therefore be seen that the device contemplated herein may be operated in such a manner that its external breakdown discharge current field achieves a uniform conductive cross section and current density, as well as a holistic and orderly rotational aspect which subsequently acts to assist in rendering such current quasi-coherent. And thus, for purposes of this device and its applications, such a discharge current field should be thought of as a special qualified type and form of DC corona or arc discharge—having significant propulsive potential (to be further examined)—which then merits technical description as an electrodynamic field.

In this respect, it may for now be emphasized that a useful level of electrically-developed thrust may be realized from the relativistic impulse of the electrodynamic field current electrons incident upon the positive collector housing sections and, postulating the operation of the device in the vacuum of space (with a physical field current volume as described), the impulse velocity of such incident field electrons may be raised to as high as 99.99% of the speed of light and more with the corresponding relativistic mass thereof then equal to 69 times their rest mass or indeed much more.

Primary Voltage Expansion Ratio

In keeping with the logic presented at the opening of the Field Induction System section above, the primary array voltage will tend to equal only one-half (½) of the DC voltage expressed across the rotor segments (or "rotor voltage"). Therefore, to develop an extraordinary multi-megavolt 'secondary' or field voltage across the Generator's housing of the type just described, the primary array cathodes' electron emissivity (expressed as a certain factor) must exceed that of the rotor field emitters by a ratio which is at least as large as the ratio of the desired field voltage to half the observed said rotor voltage. The latter such ratio is then thought of as the primary voltage expansion ratio in this application, as outlined in the Method of Operation section hereinabove.

A difference in the instantaneous rate at which these two said sets of parts will tend to discharge under the impetus of a given equivalent voltage or potential difference is thereby created. This instantaneous charge differential enables the primary cathodes to strip native electrons from the positive housing sections (5) thousands of times faster than such charge can reach the negative emitter housing sections (3) from the rotor field emitters. Thus, an instantaneous charge differential is perhaps best described as a cumulative charge imbalance that is known to operate (under certain conditions) in capacitive and/or thermoelectric circuit arrangements and to express itself as an elevation of the applied voltage or potential difference therein.

To actually achieve and support such a condition requires the use of two housing charge ballast capacitors whose negative 'plate' elements or rings are affixed directly to the rotor segments (about their outer perimeter) and which are immediately able to store an amount of such charge that is sufficient to produce equilibrium collector surface charge densities resulting in the desired field voltage. This average required housing charge density is calculated using the traditional formula given in the Hull Design section above.

The voltage applied to the positive rings of these ballast capacitors is taken from the rotor's outer field coil anode ring connections and therefore represents a large portion of the Primary Power System's generated field winding voltage. It should be noted that this voltage must actually be passed to such capacitors beneath the rotor ballrace assemblies in the form of recessed conductive traces on one or more of the segment separators. This same technique must also be employed to connect electrical elements of the Primary Power System lying outboard of the variable inductor arrays (145) with corresponding elements lying inboard thereof.

In any event, these crucial ballast capacitors are therefore properly thought of as belonging to both the Primary Power System and Field Induction System circuits. They provide the necessary electric force means by which a given primary voltage expansion ratio (as defined) may be supported and realized using the engineered instantaneous charge differential concept described. Because of the complexity of this aspect of the Generator's operation, the specific example below will illustrate the relevant principles using the respective temperature emissivity factors of the chosen field emitter and primary cathode materials with respect to the aforementioned 4ft. prototype model.

This temperature emissivity factor, $e^{-\phi/kT}$, where 'e' is the base of natural logarithms 2.71828 . . . , 'k' is Boltzman's constant, and 'T' is the absolute temperature in °K, derives from the famous Richardson-Dushman equation: a formula for the correct thermionic emission current density 'J' of a clean metal cathode in vacuum having surface work function $\phi$. And, expressed in mathematical terms, the principle of ratio equivalence defined above may be stated as follows:

Primary Voltage Expansion Ratio≈cathode $e^{-\phi/kT}$/emitter $e^{-\phi/kT}$.

Using field emitters of sintered 0.68/0.32 tungsten/copper composite and thorium-adsorbed tungsten primary cathodes, a 4 ft. diameter three-stage-rotor prototype unit of the invention's design would achieve a primary voltage expansion ratio equal to about 12,106 given a field emitter φ=4.408 eV and primary cathodes of φ=3.639 eV with both component sets at a temperature of 948° K (or 675° C.) as figured per the above equation. The field voltage expressing this ratio is verified in the Detailed Calculations hereinbelow.

It is important to note that this equation can readily be solved for the required primary cathode φ where the projected mean operating temperature of the primary cathodes is given (as it would be in operation), and where the field emitters' φ is also fixed and known but their actual operating temperature within a range of possible values must be experimentally or theoretically obtained.

The external breakdown discharge current once initiated and sustained in this manner is generally limited only by the engineered design characteristics of the unit pentode arrays which comprise the Field Induction System. In particular, the negative DC bias voltage applied to the unit pentode array control grids (65) must be sufficient to limit the total primary induction ring array current to a value within the safe operating ampacity of the rotor. For purposes of this text, the term "full-power" as used in relation to the Primary Power System and its incorporating device shall be taken to indicate a corresponding rotor speed wherein a full nominal field envelope voltage is achieved, maintained, or exceeded. Such an operational state is depicted in FIGS. 11, 12, and 13.

Field Current Bias

In a simple single-stage rotor embodiment of the Generator used as a "Thermal Power Unit", no active biasing of the current in either of the two current-carrying portions (140) of the field envelope (which are otherwise symmetrical) need take place at the primary arrays, and the current comprising each such driving portion of the field is essentially equal. In the preferred three-stage rotor embodiment intended for propulsive units, the field current is actively biased or proportionally shunted by the primary arrays between such field envelope portions (140) to render the impulse thrust developed thereby mutually non-isometric along the Generator's vertical centerline. Several important considerations directly related thereto are discussed below, and reference should generally be made to FIG. 7 in this section.

The Generator's maximum full-power total field current must be equal to the rated DC parallel ampacity of the rotor segments, as figured using traditional methods. An operational minimum full-power field current in any propulsive three-stage rotor device used as an "Impulse Drive Unit" should then be considered as equal to either one-half (½) of the so-rated rotor ampacity or a level of total rotor current sufficient to allow the Generator to produce a net vertical thrust equal to its own weight, whichever is the lesser.

Given the minimum engineered amplification factor of the unit pentode arrays (69) earlier stated, this minimum full-power field current may in all likelihood be maintained with an average value of primary array negative bias voltage (as applied to the stationary control grids (65) shown in FIG. 7) which is less than or equal to about one-half (½) of its specified design-maximum value. If no unidirectional or alternating voltage component of the Field Induction System current is present, this said average negative bias voltage value constitutes the primary arrays' "zero-signal" bias voltage and the primary arrays may be said to be in a zero-signal field bias condition (as mentioned earlier hereinabove).

Each of the two said driving portions (140) of the Generator's field envelope may be referred to as a "field hemitorus" because of its postulated shape, and the maximum individual field hemitorus current at any given value of operating rotor current should at all times be limited to a level which is less than or equal to two-thirds (⅔) of that operating rotor current. Peak net field thrust will then equal one-third the total isometric thrust. Assuming the said given amplification factor, this maximum advisable hemitorus level of proportional total field current may in all likelihood be maintained with an average value of negative bias voltage applied to the corresponding primary array's control grids (65) which is equal to approximately one-third (⅓) of its specified design-maximum value (or less proportionally at a rotor current level which is less than rated ampacity).

Due to the lag time in heating either of the two power resistor (63) networks through which an increasing field hemitorus current must return, the negative bias voltage applied to the corresponding primary array's control grids (65) may be briefly reduced to as little as one-sixth (⅙) of its specified design-maximum value (as a standard minimum operating control grid voltage) or less proportionally at a rotor current level which is less than rated ampacity.

The minimum individual field hemitorus current at any given value of operating rotor current should at all times be maintained at a level equal to or greater than one-third (⅓) of that operating rotor current. Assuming the said given amplification factor, this minimum advisable hemitorus level of proportional total field current may in all likelihood be maintained with an average value of negative bias voltage applied to the corresponding primary array's control grids (65) which is equal to approximately two-thirds (⅔) of its specified design-maximum value (or less proportionally at a rotor current level which is less than rated ampacity).

Due to the lag time in cooling either of the two power resistor (63) networks through which a decreasing field hemitorus current must return, the negative bias voltage applied to the corresponding primary array's control grids (65) may be briefly increased to as much as five-sixths (⅚) of its specified design-maximum value (as a standard maximum operating control grid voltage) or less proportionally at a rotor current level which is less than rated ampacity.

It is important to note that the current passed by the unit pentode arrays (69) will depend to a great degree on the accelerator grid (66) voltage rather than on the overall primary array potential difference, just as in any standard vacuum tube which employs a screen or accelerator grid whose positive voltage is less than the applied plate voltage. It therefore becomes evident that this positive grid (66) voltage may also be modulated in a manner similar to the negative control grid (65) voltage. This type of 'duplex' signal-handling or control voltage response capability allows the unit pentode arrays (of either primary induction ring array) to amplify a resonant frequency communications signal while simultaneously controlling an independent level of current-contingent thrust.

In any event, it can be seen here in light of the Law of Conservation of Momentum that a sizeable force of thrust will be developed by each field hemitorus (140) from the relativistic impulse of its constituent electrons incident upon the collector housing sections (5), and that suitable means have been provided for rendering such mutually-opposed y-axis thrust vectors variably non-isometric.

A less obvious but very important distinction which should be made in regard to the EDF Generator's production of such electrically-developed thrust is certainly this: it is not necessary that the Generator or in particular its positive hull sections (5) (or Field Hub) provide the work required to move the field current charge against the field potential gradient. Per classical electric field theory, the work may be done by the charge itself in being repelled along the potential gradient. In the first case, work is 'performed' and in the second it is 'recovered'. Furthermore, it can be shown mathematically in light of the preceding distinction that any net recoil force experienced by the negative hull Emitter Ring (47) is strictly Newtonian in nature, compared to the relativistic impulse thrust produced at the Field Hub, and that the peak value of such recoil would amount to no more than about 3/1,000 of one percent of the peak net value of the said thrust.

Therefore, the Electrodynamic Field Generator's input rotary torque drive means will provide the work-energy required to establish and maintain the rotor's rotation and the resultant field potential gradient that is induced in the manner described, and the electron charge comprising field hemitorus current will then do the work required to effect its passage toward the positive Field Hub. The resulting collisions are almost completely inelastic, so momentum and kinetic energy are conserved independently, and the field current's gained kinetic energy is recovered almost entirely as heat.

Field Voltage Control System

Accordingly, it can also be seen that the interactive factors or features which result in the EDF Generator's exhibited field voltage as a function of its rotor voltage are much more complicated in nature than the simple turns ratio which defines an AC transformer's secondary voltage in terms of its primary voltage. And because of the extremely high primary voltage expansion ratios which will be operative in large devices, small fluctuations in the Generator's stationary primary array electrode voltages can conceivably cause very large and undesirable fluctuations in the exhibited field voltage. Therefore, a relatively simple but effective Field Voltage Control System is provided which may be used to monitor, regulate, and adjust all individual primary cathode and grid voltages to optimum specified and/or interim operating values such that rotor ampacity is not exceeded, and this system anticipates the use of an associated onboard computer system (to render its various interactive functions automatic).

The embodiment of such a control system as shown in FIG. 10 is intended merely to provide a logical circuit model which is illustrative of the principles of the invention, and of certain principles of appropriate circuit resolution which should be applied within such a system in light of the following aspects of its teaching, and not to preclude the use of other possible embodiments of such control system circuitry.

The cathode elements (64) of each plane-parallel electrode system or unit pentode array (used to link the rotor assembly to the positive housing sections) are to have a surface work function φ which is significantly lower and/or an operating temperature which is significantly higher than that of the rotor field emitters (17), and will therefore tend to exhibit a comparatively much-higher electron emissivity, such that the ratio of their respective temperature emissivity factors (which are each represented by $e^{-\phi/kT}$) has a very determinate effect upon the respective exhibited ratio of the device's external discharge field voltage to the primary DC voltage generated internally.

Referring to FIG. 10, these primary array cathodes (64) must be composed of tungsten or another refractory metal which may also be either impregnated with thorium oxide or thorium metal submonolayer-adsorbed to achieve such lowered comparative surface work function, and, to calibrate their emissivity relative to that of the rotor field emitters (17) as a means of defining and determining the device's external field voltage relative to its primary array potential difference (or half the rotor voltage).

The Field Voltage Control System as shown is basically designed to directly accept the rather high positive induced voltage of the stationary anode rings (58) (shown in FIGS. 8 and 9) for the purpose of providing the primary accelerator grids (66) with their standard DC operating voltage. Due to the linear scalability of the Generator's overall design, the nominal (or zero-signal) value of such voltage relative to chassis ground (10) is expected to be approximately +362 to +483 volts per foot of hull diameter in three-stage and single-stage Generator embodiments (respectively). An isolation diode (126) and switch or relay (124) prevent such positive voltage from being neutralized by negative current (s) elsewhere in the control circuit.

Any one or more of the stationary electrode elements (64)–(67) comprising each said unit pentode array may be artificially cooled, as a means of further regulating the device's external field voltage, and/or subjected to modest variable DC control voltages at times to further assist in the interim adjustment of that unit pentode array's current.

A very high value capacitor (116) or a plurality of separate high value capacitors connected into a parallel or series-parallel matrix thereof may be employed to store the displacement charge caused within the Primary Power System by the charging of the rotor-mounted ballast capacitors, as part of such Field Voltage Control System. Said displacement charge holding capacitor(s) (116) may hereinafter be referred to as "ballast compensating capacitor(s)".

A very high value capacitor (117) or similar such capacitor matrix may also be employed to prevent the grounding of positive housing section potential by ambient ionization charge, from operation in air during the device's start-up period before such sections are fully enclosed (by the external field hemitorus currents), as a further part of this Field Voltage Control System. Such bulk electron storage capacitor(s) (117) may hereinafter be referred to as "ambient charge capacitor(s)".

The negative plates of these ambient charge capacitors are to be isolated from ground during rotor spin-up, in order to effect a net negative charge storage, and so their positive plate charge is supplied by a dedicated common variable DC voltage supply (98) which is oppositely connected to the ground frame. Each ambient charge capacitor (117) employed during the device's start-up period may be selectively switch- or relay-connected by its negative terminal to an accelerator grid element (66) of one or more of said plane-parallel electrode systems, in order to effect and control the storage of such ionization charge. Each such start-up capacitor (117) may also be selectively switch- or relay-connected by its negative terminal via a variable resistor and/or diode to a suppressor grid element (67) of one or more of said plane-parallel electrode systems, in order to effect and control the distribution of onboard stored negative charge reserves from the suppressor grid(s) (67) to the rotor, as a standard means of regulating the external field voltage (especially in the vacuum of space).

Said ambient charge capacitor(s) (117) may also be similarly connected by the negative terminal(s) thereof either to a separate source of true earth ground or to one or more superconductive current storage ring/s (200) (including charge deposition and retrieval means), for purposes of removing any excess ambient electron charge above the bulk storage capability of such capacitor or capacitor matrix which may be produced from normal or full-power operation in air—or other gaseous dielectric media.

Such superconductive current storage ring(s) would be used exclusively in large three-stage rotor propulsive models of the Generator, and thus constitute/s the means by which further expendable onboard charge reserves may be accumulated. The working core of each superconductive storage ring would preferably be a large but relatively thin torus (of small cross section) composed of solid mercury metal immersed in liquid helium, and as such would have a known ampacity measured in the hundreds of thousands of amps.

A linearly-actuated control rod (103) or similar mechanism may be used to effect a mechanically variable thermal junction between each primary array cathode or grid element (64)–(67) and a cold thermal mass of the same or similar refractory metal, maintained at the reservoir temperature of a secondary cryogenic housing coolant such as liquid air or nitrogen. The plate elements and dielectric media of each capacitor or capacitor matrix employed in the Field Voltage Control System could also be incorporated (in a suitable manner) into the coolant vessel which contains said cold thermal mass. This System's diodes would generally not be rated for mounting at such a low temperature.

The voltage control circuit shown in FIG. 10 is modular in nature, in that one such unit is provided for each of the 72 unit pentode arrays associated with the Field Induction System (in the preferred embodiment). All measurements of primary electrode voltage(s), and of positive housing section voltage, are to be made with respect to the Generator's ground frame (10) (as generally depicted in FIG. 1): the metallic structural shell of the device's central chamber to which the rotor carrier assembly drive motor(s) should be mounted. This grounding method is referred to throughout as "chassis ground".

One thermal control rod (103) is provided for each primary cathode and grid element (64)–(67) which variably engages both a control rod socket (104) attached thereto and a thermal junction (101), which is attached to a cold thermal mass (102) maintained at the reservoir temperature of the secondary (cryogenic) housing coolant, by means of a linear actuator (not shown). Such control rod (103) may then be used to regulate that electrode's temperature to approximately the same temperature as the associated power resistor (at 675° C. ±55°). In this manner, small adjustments in cathode (64) emissivity may be made as necessary during operation and the various grids may be closely matched in temperature to that of their respective cathode(s) to ensure the accuracy of mutual primary electrode voltage balance. Any deviation of cathode (64) voltage from a chassis ground potential may be detected and measured across a very-high-value resistor (107), connected between said cathode(s) and chassis ground, which is preferably of a large carbon type having multiple fixed taps (and across which an output voltage may exist).

A dedicated common variable DC voltage supply (95) is provided for all primary cathodes (64) as a means of ensuring an optimum cathode potential with respect to ground, despite fluctuating power resistor temperatures (in three-stage rotor devices where field hemitorus current is variably biased). This supply is shunted with a double-pole/double-throw switch or relay (123) to enable either a positive or negative interim control voltage to be applied to the cathodes (64), in order to hold their true potential as close to ground as possible. A similar voltage supply (97) and switch/relay (123) is also provided for all primary accelerator grids (66) as a means of modulating the fixed level of applied positive grid voltage (from stationary anode ring (58)) and therefore the level of field hemitorus current, independent of the level of applied control grid (65) bias. In both cases, these DC supplies are isolated from chassis ground by blocking capacitors (106) to inhibit any net charge loss or accumulation from accruing to the ground frame (10) during operation (in propulsive units which are not connected to true earth ground).

A dedicated common variable DC voltage supply (96) is provided for all primary control grids (65) as well. This voltage supply is not capacitor-isolated from chassis ground in this case, so that the primary control grids (65) and cathodes (64) may have a common direct ground reference as they would in a typical vacuum tube circuit arrangement. The said control grid supply (96) should also have a resistor (107) of the same type as that provided for the associated cathodes (64), connected between such supply's positive terminal and chassis ground. These two criteria further ensure the accuracy of mutual primary electrode voltage balance, and the nominal (or zero-signal) value of such DC control grid voltage relative to chassis ground is expected to be approximately −36 to −48 volts per foot of hull diameter in three-stage and single-stage Generator embodiments (respectively). A variable bypass resistor (108) may be adjusted to ensure a very low and relatively constant DC operating grid current despite fluctuations in the value of the AC input signal resistor (110), as discussed below.

Ballast compensating capacitors (116) are provided whereby negative outrush charge from the stationary anode rings (58) and the positive plates of the rotor ballast capacitors may be purged from the Primary Power System during rotor spin-up, to prevent stage electrode array voltage ratings from otherwise being greatly exceeded, via these same two anode rings (one per primary induction ring array), connecting switch/s or relay/s (124), and resistor/s (125). During the Generator's spin-up and 'run' periods, each ballast discharge switch/relay (122) is normally open; switch/relays (124) are 'run-open'. Upon rotor de-spin, such ground-restoring charge must be proportionately returned to each stationary anode ring via switch/relays (124) and resistors (125), and to the Primary Power System as a whole via the discharge switch/relays (122) and suppressor grid discharge shunts (with variable resistors (113) and diodes (115)), for the most part after vacuum chamber current to the hull Emitter Ring has essentially ceased.

Then, such normalizing charge may be 'dumped' across the described suppressor grid discharge shunts at a rate sufficient to ensure that the entire Primary Power System returns to a ground potential (by brief direct surge rotor-shorting to the outer induction array anode rings). Thus, resistors (113) provide a variable time constant for the discharging of the said compensating capacitors (116). An a independent common variable DC voltage supply (99) whose negative terminal is connected to the ground frame (10) ensures that the proper total ballast compensating charge described may be stored against the high positive applied potential of the stationary anode rings (58).

The ambient charge capacitors (117) absorb ionization charge (arising from operation in air) which perforce must fall into the potential well(s) established by the positive housing sections at least until the field envelope's two hemitorus currents are fully formed, and which would otherwise tend to ground the desired positive housing section voltage. Therefore, the negative plate voltage of these storage capacitors (117) is applied from another dedicated DC supply (100), which is similar to that (99) provided for the compensating capacitors (116), by means of a common dpdt switch/relay (119). None of these DC supplies (95)–(100) are to have internal load-line diodes.

The variable output of this "dynamic compensating" voltage supply (100) is to be approximately the same as that of the ambient charge capacitors' positive voltage supply (98), thereby allowing the said capacitors (117) to be gradually saturated during rotor spin-up with electrons collected at the accelerator grids via storage shunt inrush current switch/relays (121) and diodes (114). During the Generator's spin-up and run periods, the "control gate" switch/relays (119) are normally closed such that the negative pole of supply (100) is connected to the negative plates of these same capacitors. In the Generator's run and de-spin periods, however, switch/relays (121) are normally open.

Any excess ionization charge above these capacitors' joint storage capability which might lower the 'run' Field Induction System circuit voltage must then be either grounded off or deposited in said superconductive storage ring(s) (200) (in ungrounded propulsive Generators designed for maximum ambient charge storage), via the same said throw of control gate switch/relay (119) in conjunction with shunt switch/relay (120) and resistor (112). In this case, the storage shunt switch/relays (121) remain run-closed. Otherwise, the slow 'run' release and distribution of negative charge reserves to the rotor from the storage capacitors (117) is effected by the gradual synchronized relaxation of the voltage/s from supplies (98) and (100) across switch/relay (119) and discharge resistor (113), with shunt switchs (120) and (121) open, while diodes (114) and (115) ensure that the said capacitors (117) may only be discharged in the manner described.

This discharge of stored charge reserves actually takes place from the suppressor grids (67), which may serve as low-power electron emitters given their proximity to the primary anode rings (68). An isolation diode (127) prevents such negative charge from neutralizing accelerator grid circuit voltage. It should be noted that the suppressor grids may be held at ground potential as they would in a typical beam power pentode circuit arrangement, or at a very low if not negligible negative voltage for purposes of effecting such controlled low-power charge release, by means of [i] a minor negative voltage induced thereon by the corresponding proximal primary anode ring/s (proportional to their capacitance relative thereto); [ii] the combined DC voltage drop across the paralleled resistors (109) and (111) connected to their respective accelerator grids; and/or [iii] the voltage of the dynamic compensating supply (100) relative either to earth ground and resistor (112) or to chassis ground and the relative opposing voltage of the ambient charge storage capacitor's supply (98).

The bypass resistor (109) provided between each accelerator grid (66) and its associated suppressor grid (67) returns the inevitable stationary anode ring (58) and accelerator grid (66) DC circuit current to the rotor from the suppressor grids (67), and simply assists in maintaining each suppressor grid at a DC potential as close to true ground as possible. The suppressor grid resistor (111) which is paralleled with said bypass resistor (109), however, is analogous to a plate resistor on behalf of the corresponding inner (rotor) induction array in both the single- and three-stage rotor embodiments, in that any rotor circuit final-stage AC output voltage variations will be reproduced across it once field envelope circuit current commences. Likewise, any AC signal oscillations from an outside (remote) source which are induced upon the field envelope current will immediately act as a detected first-stage AC input for rotor circuit amplification, and again will be reproduced across the said grid resistor (111).

Therefore, any rotor or field circuit AC potential difference across this grid resistor (111) provides an output signal voltage that may be: [i] received by an actual communications console or a simple AC control-voltage operating circuit in the Generator's central cabin; and/or [ii] reapplied either in- or out-of-phase with the voltage across the input signal resistor (110) of the associated control grid (65) as a further AC signal voltage amplification or suppression stage (respectively). An input AC signal or control voltage may also be applied across the control grid resistor (110) from such an onboard communications console or control-voltage operating circuit, as would generally apply to three-stage and single-stage devices, respectively. This grid resistor is variable for circuit tuning purposes related to resonant frequency communications (if desired).

It can be seen from FIGS. 8 and 9, however, that the AC output amplification stage (or inner induction array) of the Primary Power System and its input stage (or outer induction array) are directly coupled by the rotor segments (14) in both single-stage and multi-stage rotor embodiments. Thus, the rotor electrical circuit as configured will be subject to continuous positive (or regenerative) feedback of any AC signal voltage present either in the field current or on the rotor, as described above. To provide a desired or requisite level of signal amplitude suppression or compensation, negative (or inverse) feedback may be applied to the rotor circuit using the feedback coupling relays (129) and stage transformers (130) shown in FIG. 10.

Because plate voltage and grid voltage are typically 180° out of phase in a beam pentode arrangement such as the Generator's primary arrays, inverse feedback is achieved when the voltage fed back to the control grid (65) has the same waveform and phase as the plate or anode (68) voltage. In related traditional practice, an inverse feedback signal applied to the input (control grid) current decreases AC amplifier input impedance and distortion; an inverse feedback signal proportional to the output (plate/anode) current raises the output impedance of such amplifier. Therefore, an inverse feedback AC signal proportional to the current through resistor (111) which is applied in-phase with the AC line current across resistor (110) decreases the rotor input stage impedance yet also reduces the amplitude of the AC output current. A loss of total amplification (through a fractional stage 'gain') results, but is accompanied by a decrease in signal distortion.

The stage feedback transformers (130) ensure voltage reference isolation between such stationary amplification or suppression stage and the corresponding rotor stages, when AC signal feedback across the control grid resistors (110) is necessary or desired. A double-pole/double-throw switch/relay (129) may be used to decouple each such transformer from the input signal resistor (110) side of its circuit connections, and/or to apply either positive (regenerative) or negative (inverse) feedback to the rotor AC amplification stage(s), and tunable blocking capacitors (131) isolate the transformers from circuit DC voltages. The coupling transformers (130), isolation relays (129), and blocking capacitors (131) are therefore only necessary in Generator embodiments not having a central AC control-voltage operating circuit with suitable inverse feedback characteristics and in three-stage Generator embodiments which may be used in a communications capacity. In the latter case, an optional capacitor across the secondary or control grid resistor (110)

side of each such transformer (in parallel with the said resistor) may once again be employed in parallel resonance fashion, and is indicated in FIG. 10.

During continuous operation of an EDF Generator in the vacuum of space, the exhibited DC field voltage will tend to rise gradually as the total amount of charge contained in the field envelope circuit is gradually reduced through unavoidable electron leakage losses (primarily at the hull Emitter Ring peripheral edge). To compensate for this effect, a small amount of stored ambient charge must therefore be continually released at the suppressor grids (67) into the rotor return current. The rate at which this gradual discharge must be effected is dependent upon the observed field leakage rate, as only a rough approximation of this leakage may be pre-calculated. It is for this reason that at least one superconductive storage ring (200)—containing a tremendous quantity of reserve ambient charge in the form of a continuous zero-loss current—must be included in any ungrounded Impulse Drive unit used in space exploration, as the capacity of such storage ring determines the vessel's effective range of operation.

It is postulated that the external field current's energy density will be sufficiently enormous that it exhibits a virtual self-evacuating operational condition above a certain ultra-high field voltage in propulsive three-stage EDF Generators, and such a condition is essential to the successful atmospheric ground launch thereof Such kinetic occlusion of a significant portion of the otherwise available ambient ionization charge may also occur once the field envelope is fully formed even in ground-based single-stage devices operated at breakdown field intensity. During continuous operation of such ground-based devices in a gaseous atmosphere, field leakage losses which could cause an undesired gradual field voltage rise if they exceed available ambient charge accretion may be compensated by bypass-shunted charge from earth ground. In this case, the positive pole of supply (100) is connected at low power via dpdt switch/relays (119) to earth ground, in order to avoid a limited spin-up/run/de-spin repeating duty cycle.

General Method of Construction

The actual construction of an Electrodynamic Field Generator of any given size is relatively straightforward, whether of a manned propulsive embodiment or not, and proceeds in fact from the inside out. Referring generally to FIG. 1, one of the most practical features of the construction process is that virtually the entire instrumentation and payload compartment or "Central Chamber" (2) may be outfitted first, before any portion of the Primary Power System is assembled or even necessarily designed. In the preferred three-stage embodiment to be used as an aerospace Impulse Drive Unit, the central chamber should obviously incorporate low-density materials wherever possible.

Construction next proceeds with the Generator's ground frame (10): the metallic structural shell which provides an enclosing framework for the central chamber to which all ancillary inboard electrical equipment may be grounded. This structural framework should be as strong, lightweight, and nonmagnetic as possible, and may preferably be of a welded tubular design using stainless steel or a suitable titanium alloy.

Once the ground frame and enclosed central chamber are completed, including the installation of a preferred total of 32 high-torque DC motor-generator rotor drive units (in four sets of eight), the two rotor mounting frame sections and attached ring gear/s (8) of the "Carrier Assembly" may be built and dynamically balanced (using a temporary peripheral spacing "jig"). Then, construction of the composite "Rotor Assembly" may commence with the laying out of equal numbers of copper segments (14), ceramic segment separators (16), and refractory composite field emitters (17) which are all of exactly equal weight by type, the latter components providing the nonconductive base to which other rotating electrical hardware may be attached.

When the three sets of said principal large rotor pieces (which preferably number 180 each) are bound together with electrode rings silver-soldered to the segments, and clamped between the two halves of the centrifuge-style carrier assembly, the assembly of the "Primary Power System" itself may begin. Once thin insulative rotor surface "facing", the aforementioned recessed and conductive separator traces, and the rotor ballraces (25) have all been affixed to the base rotor assembly, and the field coils, electrode arrays, and other rotating components have been added, the fabrication of the vessel's "Structural Intercooler System" may proceed. When this secondary thermal conduit (hull coolant) system is completed and has been pressure-tested, the "Primary and Magnetic Arrays" may be installed—including the 5-armature variable inductor array sections depicted in FIG. 14. The primary (induction ring) arrays here are comprised of the unit pentode arrays (69) as individual assemblies each having an adjunct assembly comprising a field power resistor (63), dielectric buffer (45), and primary thermal conduit (48).

Finally, once the rotor has satisfied nonenergized operational mechanical clearance and dynamic balancing criteria (using a temporary outer rotor bearing support "jig") and a final complete thermal conduit system pressure test has been made, the "Outer Hull Components" may be installed. Thus, the basic vessel construction may be completed in a total of seven distinct steps or stages. Due to the tremendous weight of the finished rotor (as the device's most massive single assembly), an operating characteristic of utmost importance is the actual rotor speed required to maintain a specification field voltage which is figured using the method outlined in the Detailed Calculations below. This will determine the rotor's operating angular momentum, which in propulsive units must be sufficiently large to provide gyroscopic stability against the use of variably-imbalanced isometric thrust (produced by field hemitorus current) but not so large that the vessel's navigational and maneuvering characteristics are thereby rendered sluggish.

It can be shown mathematically that the nominal rotor speed for a 4 ft. diameter theoretical design prototype would be roughly equal to or somewhat less than that of a typical small electric motor. However, as the size of the device increases, it will be necessary to reduce rotor rpm due to the extreme increase in the rotor's 'tip' speed and therefore the centrifugal forces to which it is subjected. Sufficient information is contained in the basic specifications which underlie this disclosure to allow engineers to reduce rotor speed as necessary in larger devices following the course of an intensive program of small device tesing; e.g., the projected nominal rotor rpm for a 20 ft. Thermal Unit is 1045.

Structural Intercooler System

The secondary thermal conduit sections which carry hull coolant or heat transfer fluid through the Generator's tapered "Drive Ring" (or the combined volume of the negative and neutral housing sections) must pass between the power resistor and unit pentode array assemblies, and so they must conform in outside dimension to the available space within the supporting framework of the neutral hull construction. The most unusual feature of these secondary conduits is that they also comprise (of necessity) the principle Drive Ring load-bearing members, and together they form the EDF Generator's structural intercooler system as illustrated in FIG. 14.

These secondary hull coolant conduits should be fashioned in a manner similar to the primary thermal conduits described hereinabove, and in the preferred embodiment would be formed in four types or varieties: [i] the initial outbound coolant supply runs (75), called "headers"; [ii] the circumferential heat transfer sections (76) (to which the Emitter Ring hull plates are fastened), called "peripheral shunts"; [iii] the inner (77) and outer (78) intermediary coolant runs, or "transfer links"; and [iv] the radial coolant returns (79) or "recovery lines". Within the Drive Ring, each of these conduit types may be fashioned as single sections which connect one to another in 'series-parallel' branch systems or zones. To wit, one header (75) from a reservoir coolant manifold (74) connects to one peripheral shunt (76) which in turn connects to one recovery line (79).

Thus, a single coolant zone is illustrated in FIG. 14, the arrows indicating the direction of coolant flow. A molded ceramic support bracket (71) having integral elbows and a set of mounting "knuckles" may be used to secure the inner corners of each two adjacent negative hull plates (72), by means of a matching mounting ring welded to each inner plate corner and a retaining pin (not shown). Each Emitter Ring hull plate (72) is to have an angle-stock thermal transfer channel welded along but just inside its inner edge (as indicated by dashed lines), which encloses the corresponding peripheral shunt (76).

These coolant headers, shunts, transfer links, and recovery lines are preferably formed of molybdenum tubing, and would take advantage of the high thermal conductivity and electrical resistance of a thin Alumina coating thereon to absorb excess heat from the single-stage Drive Ring hull and (in particular) the Emitter Ring hull plates. In single-stage rotor devices which are used as Thermal Power Units, the recovery lines then exit the Generator housing through two exchange manifolds (as stated earlier), from a preferred total of 72 individual coolant zones, to an external heat exchanger. Just how effective this method of cooling the Drive Ring as a whole will prove to be during operation in air, using the preferred liquid air or nitrogen coolant, is somewhat difficult to project. Liquid helium could alternatively be used in this respect to ensure adequate hull cooling, but would entail significantly increased piping and pumping difficulties in doing so.

It is expected, however, that the intercooler system described will be satisfactorily effective during the operation of three-stage devices in the vacuum of space, and is principally designed with this mode of usage in mind. Accordingly, it is believed that an Impulse Drive Unit operated in space will be able to purge its excess heat by actually circulating the primary conduit liquid sodium or equivalent through the secondary thermal conduit system (instead of the cryogenic coolant). In this case, the intercooler structure is used to transfer heat to the Emitter Ring hull plates as a radiative heat sink. This cooling method would provide the necessary means of liberating the Generator from permanent ground-based support to achieve free-ranging operation in space.

Neutral Housing Section Construction

In order to establish and withstand the action of the field envelope discharge current, the surface of the neutral sections of the Generator's housing or hull (or "Neutral Ring") must be constructed entirely of specialized nonconductive material(s) which should be applied in two layers to an underlying superstructure that is actually conductive in nature. It is proposed that overlapping ceramic 'tiles' be used in this regard, in a manner rather like that employed on the NASA space shuttles, which are adhesed to an underlying deck of structural nonmetallic sheet stock While the intercooler system conduits (described in the preceding section) comprise the principal load-bearing members which support the Drive Ring portion of the hull, a system of beams (153) and struts (152) that are also composed of the same nonmetallic structural material as the deck or a similar and compatible material should be utilized to further strengthen and 'unitize' the Drive Ring superstructure such that an internal hard vacuum may be drawn and maintained prior to operation. These secondary load-bearing members are also depicted in FIG. 14, and in a preferred embodiment these members and the base deck material itself would be composed of a carbon composite commonly referred to incorrectly as graphite.

Sophisticated carbon composites similar to those found in golf-club shafts and racing-bicycle frames were first developed to make use of their special combination of extreme strength, rigidity, and lightness in aerospace applications. These materials are generally made from polyacrylonitrile (PAN) carbon fibers which are heated under tension to drive off the non-carbon portion. The individual fibers are about 7 microns in diameter and approach 300 kpsi in tensile strength. They may then be pulled into a rope-like 'tow' or woven into a fabric-like 'matte' before being coated with either epoxy or polyester resin. Therefore, carbon composites are eminently suited to forming rods, tubes, and sheets, and display excellent vibration damping characteristics. The final product is, however, still very expensive per pound.

To simplify the vast diversity in specialized grades of PAN carbon composite for purposes of this application, this material should be considered as coming in two basic density grades: low-density "deck" grade (at about 35% of the specific gravity of sheet steel), and high-density "beam" grade (at about 65% of the specific gravity of structural steel). It is also available in two standard temperature grades, depending on the bonding agent used: a 350° F. rating (lo-temp) epoxy-bonded material and a 750° F. rating (hi-temp) polyamide-bonded composition. The hi-temp grade only should be employed in the Neutral Ring, but the lo-temp grade may be used to build the Central Chamber.

Thus, a low-density/hi-temp grade of carbon composite laminate should be used as the basic deck material in construction of the Neutral Ring hull sections. To wit, this deck layer itself is initially affixed to the vessel superstructure by solvent welding and/or mechanical means. The PAN carbon deck, a middle layer of ceramic substrate plates and an outer skin of exolayer tiles together then comprise the composite Neutral Ring hull. Several factors enter into the selection of an appropriate ceramic material for the substrate layer plates. Of primary concern here is that the material of choice have a very high volume resistivity and very low thermal conductivity at temperatures from 300–500° C. It is also important that the material have a very low thermal expansion coefficient, as the substrate layer plates must be bonded to the deck layer with a refractory-class adhesive. Therefore, the substrate material should also be non-vitreous and have relatively high porosity to promote adequate adhesion. One of the Cordierite class of compounds, bearing CeramTec designation 447, has relatively low hardness and flexural strength but should function admirably in Thermal Power Units as the center layer of a bonded composite construction given its other highly desirable characteristics. Impulse Drive Units will require an alternate substrate plate material as discussed below.

The selection of a ceramic material for use as the exolayer dielectric thermal tiles of the EDF Generator's housing or hull is contingent upon the operative field voltage, and therefore different materials must be specified for Thermal and Impulse Drive Units. To prevent substantial skin conduction losses, the minimum dielectric value k for the exolayer tile material used in Thermal Power Units has been calculated (using the peak field voltage) at approximately k=9. Therefore, the material of choice is a Zirconia composition bearing CeramTec designation 848, with a minimum (high-frequency) dielectric constant of 28. Even though this material has a comparatively high thermal expansion coefficient, it has very low thermal conductivity and is very dense and hard. Moreover, it exhibits exceptional flexural strength and resistance to fracture.

The minimum dielectric value k for the exolayer tile material used in Impulse Drive Units has been calculated at approximately k=107. Therefore, the material of choice is the same titanate composition prescribed for the dielectric buffers (and described in some detail in a previous section). Known chemically as Sodium Bismuth Titanate (and commercially as Kézite), this highly unusual compound is technically a piezoelectric material, but is also ferroelectric in that its dielectric constant actually increases on temperature rise to a peak low frequency value of about 3,100 at its 655° C. curie point. Like most ferroelectrics, its tensile and flexural strengths are quite low yet it is very dense and exceedingly hard. It does, however, exhibit a thermal expansion coefficient which is very high for a ceramic material.

The expected higher flexural stresses upon the Neutral Ring of an Impulse Drive Unit (compared to a Thermal Power Unit) may prove sufficient to crack the substrate plates were they composed of the Cordierite material described above. The Zirconia compound mentioned earlier should therefore be substituted for Cordierite 447 as the substrate plate material in Impulse Drive Units. This would likely stiffen the composite Neutral Ring hull adequately to prevent such stress cracking, while effecting a much closer match in thermal expansion coefficient to the titanate tiles. In both Thermal and Drive Units, the exolayer tiles should be applied to the substrate plates with a refractory-class adhesive in a mosaic overlay pattern, such that the edges of each exolayer tile are evenly spaced as far as possible from the underlying edges of the nearest substrate plates.

Because the underlying deck layer of the Neutral Ring hull will be quite conductive when composed of carbon composite sheeting, and referring now to FIG. 1, it becomes imperative to use an auxiliary dielectric buffer (50) between the inner edges of the Emitter Ring (47) hull plates and the outer edge of the said deck layer to prevent an otherwise enormous deck leakage current from occuring. Although it might seem that the much-cheaper and nearly-as-strong fiberglass composites available (which are nonconductive) would tend to minimize any such leakage current condition, their use would not prevent the possible build-up of unacceptable levels of static charge within the working induction compartment (12). Therefore, the use of conductive deck material ensures that the Faraday shielding principle protects Neutral Ring components from transient static voltages because the presence of a finite deck leakage current means the deck layer is a charged conductor, whereupon any net static charge must be external.

A secondary concern is the actual operating temperature of the contact areas where the deck layer abuts to both the auxiliary (50) and primary (45) dielectric buffers, which must be kept below the 750° F. temperature rating of the carbon composite. It can be shown mathematically that the deck leakage current can be held to a thoroughly acceptable fractional amperage per $cm^2$ of such contact area if this condition is met. In Thermal Power Units, the use of a secondary cryogenic hull coolant should keep the auxiliary buffers (50) and outer deck contact areas at a temperature which is under the said rating. Doing so at the primary buffer (45) contact area locations may well require the use of auxiliary cryogenic thermal conduits in both Thermal and Drive Unit models of the EDF Generator. The auxiliary dielectric buffers in any given Generator should be composed of the same material used in that device's exolayer tiles, and should be of about half the radial thickness of the primary buffers employed therein.

While the specific materials discussed above should not be construed as critical to the EDF Generator's proper construction, their properties and characteristics are highly indicative of the rather involved considerations which must be undertaken to ensure that the neutral sections of the vessel hull are physically suited to optimizing a given size device's performance and minimizing its housing maintainance or repair requirements.

Stationary Electromagnetic Armatures

Because the EDF Generator's stationary electromagnetic armatures have no bearing on the device's rotor or field voltages, and no direct connection therewith, they are properly thought of as being part of neither the Primary Power System or Field Induction System circuits but rather a separate ancillary subsystem intended to optimize the invention's overall performance and efficiency in a number of important ways. To this end, their main purpose is to create and independently control a variable level of both rotor torque and field current rotational force, as necessary or desired.

Figure 16:
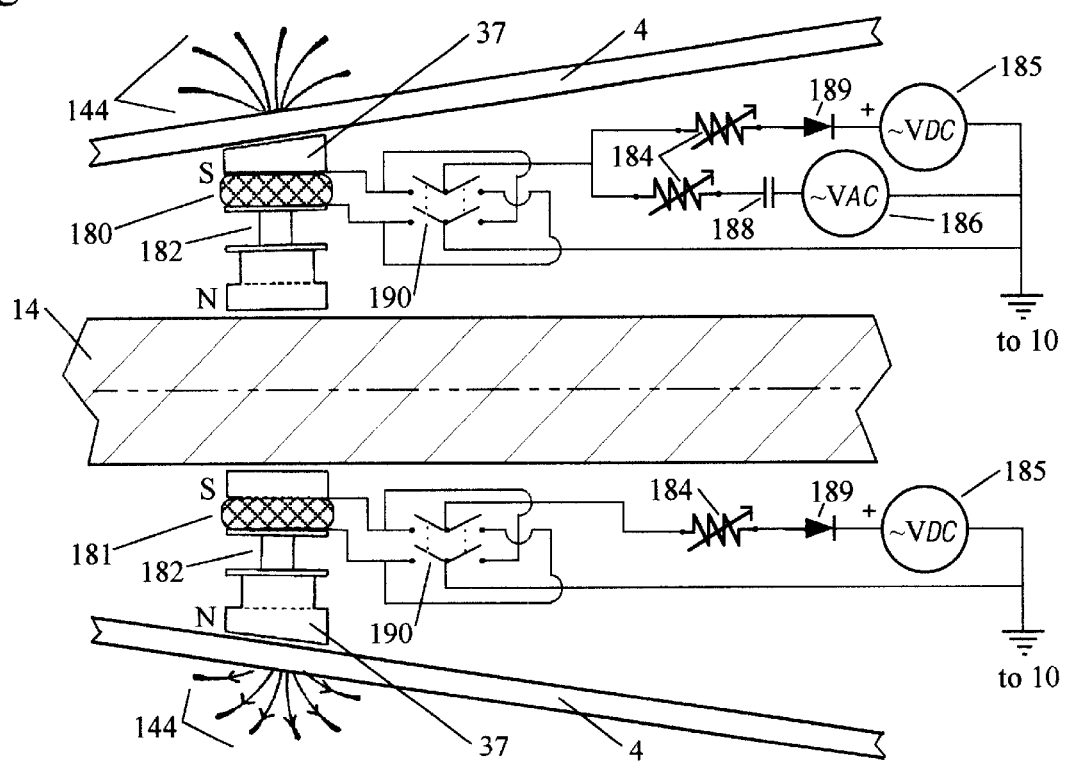
FIG. 16 shows a schematic of the stationary armature power circuit of the invention.

As depicted in FIG. 14, the individual stationary armatures (37) (or "variable inductors") may be installed in 5-armature groups or array sections within the Neutral Ring of the hull, using notched and mating supports (151) which firmly clamp the armatures about a reduced diameter center section of each armature core. These armatures and a basic control circuit arrangement for them are shown in FIG. 16, with the polarities indicated being those which would result in a clockwise rotation of the rotor as viewed from above. This armature power distribution system may be manually adjusted and/or automatically controlled (using a computer and/or other circuitry).

In both single-stage and three-stage embodiments of the Generator, each of the two electromagnetic armature arrays should be wired in parallel from one or more separate source(s) (185) of low-voltage DC current which is/are chassis-grounded and which is/are common to the armatures (37) of that array. No variable regulation or biasing of individual armature DC current(s) in single-stage rotor or Thermal Power Unit devices is necessary. The desired individual biasing of armature DC current in three-stage rotor devices, for propulsion-related reasons explained below, may be simply accomplished through a variable resistor (184) associated with each armature and its DC power supply subcircuit(s). A minor unidirectional or alternating voltage component of such armature supply current may be added across or in parallel with such resistor (184), using an AC power source (186) and/or suitable control interface of a conventional nature, in either single-stage or three-stage Generator embodiments as desired.

Each stationary armature (37) incorporates two separate electrical coils (180)–(181), to be operated principally on DC voltage, which are formed of conductive insulated magnet wire multi-layer wound upon a single ferromagnetic core. Each such armature core also incorporates a connecting center section or "flux reductor" (182) between said separate coils which is of a significantly reduced cross-sectional area with respect to the balance thereof, and which is designed to saturate magnetically when the respective core flux density of either of said coils is approximately equal to or greater than half saturation value. Pure annealed iron or low-carbon steel should be used as the armature core material, due to the high permeability, superior intrinsic induction, and low hysteresis thereof.

The inner or "flux initiator" coils (181) of these electromagnetic armatures (or those closest to the rotor) may be used as a means of creating axial magnetic fields of force (144) which are perpendicular to the plane of the current-carrying rotor segments (14). Thus, when powered collectively at a common DC current value, the said inner armature coils (181) in conjunction with their respective cores may serve as a source of uniform yet variable secondary input rotary torque (or in a torque-assist capacity) for the invention in the course of its normal operation as an electrical generator.

The flux initiator coils (181) are so-named because their as-wound polarity relative to the fixed outward direction of the primary DC rotor current establishes both the direction of rotor rotation and the required winding direction and polarity of the outer (and similar) armature coils (180). The said inner coils (181) are energized by a variable DC power supply (185), through an output variable resistor (184) and a filter diode (189) which blocks induced positive AC half-cycles (if any) from crossing the negatively-grounded DC supply (185). Such power supply (185) must, however, be sufficiently rated to carry any corresponding induced unidirectional negative current impulses to ground, and may be of a solid-state or rotary induction design.

The axial armature-produced fields (144) described may also be individually and variably superimposed on the rotor to develop a selectively controllable force of rotational torque upon its current-carrying segments (14), through variable regulation of the principal DC current in individual armature inner coils (181), such that a locally-unbalanced force of angular acceleration may be applied to the rotor and therefore a directional force of horizontal thrust may indirectly be imparted to the housing for lateral flight maneuvering in propulsive three-stage rotor devices.

The outer coils (180) of the stationary electromagnetic armatures, or those closest to the field envelope, may be used as a means of creating axial magnetic fields of force (144) which in this case are essentially perpendicular to the described field current arc trajectories. This situation is best illustrated in FIG. 12, which shows the hull location of the two variable inductor arrays (145) (or circular groups of armatures (37)). Thus, when powered collectively at a common DC current value (including any minor unidirectional or alternating component thereof), these outer armature coils (180) in conjunction with their respective ferromagnetic cores serve to impart an attenuating yet holistic and orderly rotational vector moment upon the external discharge current. The general effect of such applied magnetic rotational force, which may be used to modify or modulate the field's electrodynamic characteristics, is further depicted in FIG. 13.

Referring again to FIG. 16, and to continue in the same vein, it is postulated that the quasi-coherent aspects of the field envelope may actually be optimized through the proper control of the amplitude, frequency, and/or phase relationships between any minor AC voltage component of the field envelope current and the said minor AC current (if any) collectively supplied by AC power source (186) to the outer or "transflection" coils (180) (of each variable inductor array). This consideration applies to both single- and three-stage embodiments of the Generator, although it is decidedly more important in the case of the latter, and may also allow the engineered reduction of field radiative emissions.

These transflection coils (180) are so-named because they may be used to impart a variable transverse deflectionary force upon all of the radially-impinging field current electrons. In the region(s) of the field envelope shown in FIG. 11 between the surface of each neutral hull section (4) and the corresponding field envelope inner boundary (142), this magnetic force may in fact be large enough to produce a continuous annular flow of "displacement charge" current. In any event, and as shown in FIG. 16, such outer armature coils (180) are also energized by a variable DC power supply (185) which is similar in type to that of the inner coils (181), through an output variable resistor (184) and filter diode (189). In addition, a variable AC power source (186) may impress a minor unidirectional or AC voltage upon the DC current supplied to the said transflection coils (180), either across or in parallel with the output resistor(s) (184) of their respective DC power supply subcircuit(s), through separate output variable resistors (184) and DC blocking capacitors (188) connected to said AC power source.

The axial magnetic fields (144) produced by the armatures (37) may also be individually and variably superimposed on the field envelope to develop a selectively controllable rotational force upon the described field hemitorus current, through variable regulation of the principal DC current in individual outer (or transflection) coils (180), such that a locally-unbalanced force of angular acceleration may be applied to such hemitorus current. Any such angular force imbalance will cause a corresponding change in the local field current density and therefore a secondary directional force of variable thrust in the z-axis may indirectly be imparted to the housing in propulsive devices, yielding a further measure of navigational attitude control over non-isometric thrust produced by the Generator which may otherwise be largely unilinear.

Given the nature of the flux reductor (182) as described above, it can be seen that either the inner or the outer armature core sections may be collectively or individually operated at any flux density above half of saturation level without significantly affecting the operating flux density of the respective opposite core sections, provided both corresponding sets of armature coils ((181) and (180) respectively) are powered by DC current of the same relative polarity. Thus, the base collective full-power operational level of flux density in the inner armature core sections of a three-stage rotor Impulse Drive Generator should be roughly half saturation level, in order to facilitate the achievement of temporary local rotor torque imbalances for propulsive purposes as described above. Such inner core section base flux density for single-stage rotor or Thermal Power Unit devices may be any desired in a range between 0 and 100% of saturation.

As shown in FIG. 16, means have nevertheless been provided for reversing the fundamental DC polarity of either the inner (181) or outer (180) coil of any given armature (37), without changing the given polarity of such coil's DC power supply (185), using a dpdt relay (190). It can be seen that this simple feature allows a counter-polarity magnetomotive force (or counter-mmf) to be applied to either wound core section of any given armature, with respect to the core polarity of that armature's opposite wound section. This feature, when taken in conjunction with the described nature of the flux reductor(s), enables the outer armature core sections in both single- and three-stage devices to be operated at nearly any flux density within their output capability which might be required to optimize the desired quasi-coherent properties of the field envelope, despite the relative polarity and/or flux density of the inner armature core sections. In both single- and three-stage devices, these same two features also allow a substantial level of braking or counter-rotational torque to be applied to the Generator's rotor —by any or all of the inner armature core sections— while maintaining such an optimum level of flux density in the outer armature core sections: even if the two such opposite core sections are operated at opposite respective polarities.

Detailed Calculations for Preferred Embodiment

It is important to note that all of the underlying specifications pertaining to the size and/or positioning of Primary Power System components located within the hull's neutral section region (or "Neutral Ring") are given in terms of fractional increments of the hull radius ($R_h$) and/or the radial width of the Neutral Ring ($C_v$–$C_a$). This means that these components may be easily scaled in exact proportion to the hull, for any selected radius thereof, with no significant error or modification. However, an upper limit of vessel size utilizing the technology represented by the EDF Generator probably exists at a hull diameter not greatly above 100 feet, due to inordinate DC Field Voltage concerns (as that voltage is calculated using the method below).

Table of Dimensions

| | |
|---|---|
| Hull Radius = $R_h$ | |
| Hull Volume Constant ($C_v$) | $C_v = \frac{1}{5}R_h$ |
| Hull Area Constant ($C_a$) | $C_a = 0.012919 C_v$ |
| Drive Ring Radius ($r_f$) | $r_f = 2C_v$ |
| Emitter Ring Radius ($r_{neg}$) | $r_{neg} = C_v + C_a$ |
| Neutral Ring Radius ($r_{neut}$) | $r_{neut} = C_v - C_a$ |
| Field Hub Radius ($r_z$) | $r_z = 3C_v$ (Note: $R_h = r_f + r_z$) |
| Polar Hull Constant ($h_z$) | $h_z = 0.1421245 r_z$ |
| Polar Volume Differential ($X_h$) | $X_h = \frac{(r_z^2 - h_z^2)}{2h_z}$ |
| Radial Hull Constant ($R_s$) | $R_s = h_z + X_h$ |
| Area of Positive Zone ($A_z$) | $A_z = 2\pi R_s h_z$ |
| Area of Negative Section ($A_n$) | $A_n = \frac{s(C+c)}{2}$, where: |
| | $s = \sqrt{(C_v + C_a)^2 + (\tan\alpha(C_v + C_a))^2}$, |
| | $C = 2\pi R_h$, and |
| | $c = 2\pi(R_h - (C_v + C_a))$, and |

The variable '$\alpha$' equals the displacement angle of the Emitter Ring negative sections (with respect to the hull's horizontal centerline plane), which is preferably 7.5° to 8° each.

Note: $A_z = A_n$.

Volume of Central Section ($V_c$)    $V_c = \pi r_z^2 h_f$, where $h_f = r_f(\tan\alpha)$, and $\alpha$ is the said Emitter Ring angle.

Volume of Positive Zone ($V_z$)    $V_z = \frac{2}{3}\pi R_s^3 - \pi \frac{R_s^2 X_h - X_h^3}{3}$ Vol. of Drive Ring Section ($V_f$)    $V_f = \frac{\pi h_f (R_h^2 + R_h r_z + r_z^2)}{3} - \pi r_z^2 h_f$ Note: $V_z = V_f$ Total Hull Volume ($V_t$)    $V_t = 2(V_z + V_f) + 2V_c$ Field and Rotor Voltages Part A: Model Unit Field Intensity

[1] The Marginal Envelope DC Field Intensity for all EDF Generator models regardless of type should be equal to the breakdown dielectric strength of air or vacuum at 3 million ($3 \times 10^6$) volts/meter, as measured along a full pure semicircular arc drawn from the center point on the surface of either hull Positive Zone (5) to any exterior point on the vessel's design hull configuration which lies on the horizontal centerline plane thereof. This distance shall be referred to as the "Drive Field Perimeter" (141), as shown in FIG. 11, and is taken to represent the longest continuous DC field current trajectory.

[2] For purposes of these Specifications, the "Drive Field Boundary" (142) shall represent the distance measured along a full pure semicircular arc from any point on the outer peripheral edge of either hull Positive Zone (5) to the closest point thereto which lies on the inner peripheral edge of the vessel's corresponding negative hull section (3) (as shown in FIG. 11), and is taken to represent a shortest such DC drive current trajectory.

Part B: Thermal Power Units

[1] The Nominal Field Voltage (nom.$V_f$) should be numerically equal to 1.5 million ($1.5 \times 10^6$) times the vessel $R_h$ as measured in feet. This value is also equal to the Thermal Unit's standard design Primary Voltage Expansion Ratio of 750 times its Specification DC Primary Array Voltage, as a function of the charge stored within the Primary Power System's two Field Ballast Capacitors and of the Unit's primary cathode emissivity.

[2] The Specification Field Voltage (spec.$V_f$) should be equal to the Marginal Envelope DC Field Intensity times the distance comprising the Drive Field Perimeter, or (as presently calculated under the above directive) 0.9666 times the Nominal Field Voltage. This value shall constitute the Unit's standard operating value of field envelope voltage.

[3] The Peak (design operating maximum) Field Voltage (max.$V_f$) shall be equal to 110% of the Specification value thereof, and should never be exceeded in operation.

[4] The Nominal Rotor Voltage (nom.$V_r$) would be numerically equal to one-third the product of 1,000 ($1 \times 10^3$) times the vessel $R_h$, as measured in inches, as a gauge of the basic full-power DC generator value of rotor rotational speed, in a 'single-stage' device.

[5] The Specification Rotor Voltage (spec.$V_r$) should be numerically equal to 0.25776% of 1.5 million ($1.5 \times 10^6$) times the vessel $R_h$ as measured in feet, and is also equal to 0.9666 times the Nominal Rotor Voltage. This value would constitute the standard operating value of DC rotor voltage, as a function of the engineered Primary Power System output at a nominal design rotor rotational speed.

[6] The Peak (design operating maximum) Rotor Voltage (max.$V_r$) shall be equal to 110% of the Specification value thereof, and should likewise never be exceeded.

[7] The Specification DC Primary Array Voltage (spec.$\Delta V_p$) will be equal to half (½) of the Specification Rotor Voltage, and affects all primary array electrode spacings.

Part C; Impulse Drive Units

Unlike the case with Thermal Power Units, it is not possible to specify in one step a Nominal Field Voltage for Impulse Drive Units which is a linear function of the hull radius $R_h$; the DC Field Voltage which must be produced to achieve the chosen design goal for net linear thrust output, equal to five-thirds the Earth's pull of gravity, is jointly proportional to the rotor ampacity which rises as a function of the square of increases in $R_h$ and to the vessel weight (which rises as a function of the cube of $R_h$ increases).

Therefore, a Marginal Field Voltage is initially to be computed for Impulse Drive Units which reflects a projected theoretical operating value of DC Field Voltage required to produce a vessel acceleration approximately equal to 1.67 'g' outside of a proximal gravity field. This Marginal Field Voltage is to be calculated using the "specific impulse" of the vessel concerned (in nt-sec), and for purposes of the application contemplated herein this term is hereby defined as being equal to five times the vessel weight (in newtons) divided by the rotor ampacity times the number of electrons per coulomb.

[1] Accordingly, the Marginal Field Voltage shall then be equal to the Unit's specific impulse ($F_{dt}$) times the speed of light (c) divided by the unit electron charge (q).

[2] An estimated nominal Field Voltage will also be computed whereby a nominal value for the final electron speed of Drive Field current is assigned which is in fact a linear function of $R_h$, as applicable to vessels of from 4 to 100 ft. in diameter only.

[3] The Nominal DC Field Voltage (nom.$V_f$) should then be equal to the simple average of the Marginal Field Voltage and the said estimated nominal Field Voltage.

[4] The Specification Field Voltage (spec.$V_f$) should equal the Nominal DC Field Voltage (nom.$V_f$) divided by an assigned engineering design constant equal to 0.982826.

[5] The Peak (design operating maximum) Field Voltage (max.$V_f$) shall be equal to 110% of the Specification value thereof, and should never be exceeded in operation.

[6] The Nominal Rotor Voltage (nom.$V_r$) would be numerically equal to one-fourth the product of 1,000 ($1 \times 10^3$) times the vessel $R_h$ as measured in inches, as a gauge of the basic full-power DC generator value of rotor rotational speed, in a 'three-stage' device.

[7] The Specification Rotor Voltage (spec.$V_r$) should be numerically equal to 0.19332% of 1.5 million ($1.5 \times 10^6$) times the vessel $R_h$ as measured in feet, and is also equal to 0.9666 times the Nominal Rotor Voltage. This value would constitute the standard operating value of DC rotor voltage, as a function of the engineered Primary Power System output at a nominal design rotor rotational speed.

[8] The Peak (design operating maximum) Rotor Voltage (max.$V_r$) shall be equal to 110% of the Specification value thereof, and should likewise never be exceeded.

[9] The Specification DC Primary Array Voltage (spec.$\Delta V_p$) will be equal to half (½) of the Specification Rotor Voltage, and affects all primary array electrode spacings.

[10] The design Primary Voltage Expansion Ratio for each Impulse Drive Unit should then be equal to the ratio of Specification Field Voltage to Specification DC Primary Array Voltage, and is once again a function of the ballast capacitor charge and of the primary cathode emissivity as in the case with Thermal Power Units.

Example of Specific Unit Voltage Values

Four-foot diameter model

Section A: Thermal Power Units

A 4 ft. EDF Generator constructed for use as a Thermal Power Unit would have specific Rotor and Field Voltages, according to the preceding instructions, as follows:

[1] The Nominal Rotor Voltage (nom.$V_r$) will be equal to 8,000.

[2] The Specification Rotor Voltage (spec.$V_r$) will be equal to 7,732.8.

[3] The Spec. DC Primary Array Voltage (spec.$\Delta V_p$) will be equal to 3,866.4.

[4] The Nominal Field Voltage (nom.$V_f$) will be equal to 3,000,000.

[5] The Specification Field Voltage (spec.$V_f$) will be equal to 2,899,800.

The corresponding Primary Voltage Expansion Ratio (for this and any single-stage Thermal Power Unit) will thus be 750:1, and in this case is equal to 2,899,800/3,866.4.

Section B: Impulse Drive Units

A 4 ft. diameter three-stage-rotor EDF Generator constructed for use as an Impulse Drive Unit would have specific Rotor and Field Voltages, according to the preceding instructions, as follows:

[1] The Nominal Rotor Voltage (nom.$V_r$) will be equal to 6,000.

[2] The Specification Rotor Voltage (spec.$V_r$) will be equal to 5,799.6.

[3] The Spec. DC Primary Array Voltage (spec.$\Delta V_p$) will be equal to 2,899.8.

[4] Marginal Field Voltage: The 4 ft. Drive Unit's Marginal Field Voltage, which represents a projected minimum standard operating value of field envelope voltage, is based upon the vessel's specific impulse ($F_{dt}$)—given its calculated design rotor ampacity of $I_{max}$=38,160 amps and estimated weight of 79.2 lbs/ft³—which is computed as follows:

$$F_{dt} = \frac{5(9.8 \text{ m/sec}^2)V_t(79.2 \text{ lbs/ft}^3)}{(3.816 \times 10^4 \text{ coul/sec})(6.25 \times 10^{18})(2.2 \text{ lbs/kg})}$$

where $V_t$=2.5068 ft, as calculated by the formulas in the Table of Dimensions above using an Emitter Ring displacement angle ($\alpha$) of 7.5°. Therefore, $$F_{dt} = \frac{5(9.8 \text{ m/sec}^2)(90.245 \text{ kg})}{23.85 \times 10^{22} \text{ electrons/sec}} = 1.8541 \times 10^{-20} \text{ nt-sec/electron}^*$$

*This impulse represents the instantaneous force of thrust produced by each Field current electron's collision with the Field Hub (equivalent here to: kg-m/sec/electron).

Therefore, the Marginal Field Voltage is equal to:

$$\frac{F_{dt}c}{q} = \frac{(1.8541 \times 10^{-20} \text{ nt-sec})(299.7925 \times 10^6 \text{ m/sec})}{1.6 \times 10^{-19} \text{ coul}} =$$

$$34.7403 \times 10^6 \text{ volts (nt-m/coul)}$$

[5] Estimated Nominal Field Voltage: The 4 ft. Impulse Drive Unit's estimated nominal field voltage, which represents an alternate but extremely accurate projection of the minimum standard operating value of field envelope voltage, is based upon a nominal value for the final electron speed of Drive Field current ($\Delta V_e$) which is an assigned linear function of the vessel $R_h$ and is calculated as follows:

$$\Delta V_e = [0.999 + (2R_h - 4)(1.03125 \times 10^{-5})]c,$$

where $R_h$ is in feet, for vessels from 4 to 100 ft. in diameter.

Therefore, $\Delta V_e = [0.999 + 0(1.03125 \times 10^{-5})]c = 0.999$ c.

The purpose of this text subsection is to verify that a goal-requisite level of Field current thrust may be produced by the Electrodynamic Field Generator, at an operating DC Field Voltage approximately equal to that stated above, within the ampacity of the rotor and at an assigned value of Field current electron velocity (for this model) equal to 0.999c. In this manner, it is hoped that unnecessarily high operating Drive Field Voltage may be avoided, by virtue of design (due to the finite level of unavoidable uncertainty in the relativistic values involved), without sacrificing device performance.

(a) The amount of thrust (force) required to produce an acceleration of 1 g, thus exactly compensating the weight of the Impulse Drive Unit or its normal acceleration due to Earth's gravity, may be calculated by Newton's Second Law as follows:

F=mg, where m=est. design mass* of 90.245 kg, and g=9.8 m/sec².

*Note: The estimated design weight of any given Impulse Drive Unit is 79.2 lbs/ft³.

Thus, F=884.4 nt.

(b) Since impulse equals change of momentum, the electron thrust developed by the Drive Field equals the total relativistic mass of Field current times the incident current velocity (as the final electron velocity equals zero). The amount of impulse thrust which is equivalent to 1 g in this example is 884.4 nt.

Therefore, let $\Sigma M_t \Delta V_e = 884.4$ nt.

(c) The design goal for net linear thrust output of any given Impulse Drive Unit is 16.333 m/sec² at the minimum standard operating value of Field Voltage and rated rotor ampacity ($I_{max}$) Therefore, given the considerations of Field Current Bias values (as were outlined in an earlier section), total isometric thrust at Marginal Field Voltage must equal 5 g. The largest current available to effect a Field impulse equivalent to 1 g is then equal to:

$$I_g = I_{max}/5 = 7,632 \text{ amps}.$$

(d) Since $\Sigma$ equals the total number of electrons comprising a Drive current of $I_g$, we find:

$$\Sigma = I_g (6.25 \times 10^{18}) = 4.77 \times 10^{22} \text{ electrons/sec}.$$

(e) Therefore, from [b] above:

$$884.4 \text{nt}/\Sigma = M_t \Delta V_e, \text{ and } M_t \Delta V_e = 1.8541 \times 10^{-20} \text{ kg-m/sec/electron}.$$

(f) Letting $\Delta V_e = 0.999c$, where $c = 299.7925 \times 10^6$ m/sec, we calculate $M_t = 619.08 \times 10^{-31}$ kg, or about 67.96 $m_o$, where $m_o$=the electron rest mass of $9.11 \times 10^{-31}$ kg.

(g) If $m_i$ equals the relativistic mass equivalent of the gained kinetic energy of each Drive Field electron, then $M_t = m_o + m_i$.

Therefore, $m_{i=Mt} - m_o = 619.08 \times 10^{-31} - 9.11 \times 10^{-31} = 609.97 \times 10^{-31}$ kg.

(h) Each Drive Field electron's gained kinetic energy ($E_q$) equals $m_i c^2$. Using a precise value of $8.98755 \times 10^{16}$ for $c^2$, we obtain $E_q = (6.0997 \times 10^{-29})(8.98755 \times 10^{16}) = 54.8214 \times 10^{-13}$ joules.

(i) Here, $E_q$ also equals $W = q(\text{est}.V_{nf})$, where q=electron chg. @$1.6 \times 10^{-19}$ coul., and est.$V_{nf}$=est. nominal Field Voltage.

Therefore, $E_q/q = \text{est}.V_{nf}$, and est.$V_{nf} = 34.2633 \times 10^6$ volts (joules/coul).

Thus, we find that the estimated nominal Field Voltage required to develop requisite thrust is in fact well within the thrust goal parameters discussed above, at 98.63% of the projected Marginal value (calculated in the preceding subsection B[4]).

[6] The Nominal DC Field Voltage (nom.$V_f$) should therefore be equal to the simple average of the Marginal Field Voltage projected earlier and the estimated nominal Field Voltage Oust computed), at $34.5018 \times 10^6$ volts.

[7] The Specification Field Voltage (spec.$V_f$) should then be equal to the Nominal DC Field Voltage divided by the said design constant 0.982826, at $35.1047 \times 10^6$ volts. This value shall constitute the Unit's standard operating value of field envelope voltage.

[8] The design Primary Voltage Expansion Ratio for this model Impulse Drive Unit is therefore equal to $(35.1047 \times 10^6)/2,899.8 = 12,106:1$, as was referred to earlier.

From the foregoing description it will be observed that the present invention provides a remarkable level of electrical and thermal output in a lower-voltage corona discharge induction embodiment, which is intended for use in a utility or physical plant application. However, this invention also provides the potential for an appreciable level of net impulse thrust in a higher-voltage arc discharge induction embodiment intended as an electrically-propulsive aerospace vessel. It can be seen as well that the Electrodynamic Field Generator and the electromotive field of force produced thereby will moreover fulfill the stated objective of NASA's premier Breakthrough Propulsion Physics Program: to discover a method whereby "a vehicle can create and control an asymmetric force on itself without expelling a reaction mass" and which satisfies conservation laws in the process. Such a vessel could perhaps be made to attain a velocity commensurate with its collector field electron collision velocity, and affords hope that true interstellar travel might therefore become possible as well. While there is due cause for some concern as to the EDF Generator's production of high-frequency radiative emissions coincident with its production of heat and impulse thrust using the new means described, it is postulated that the electromagnetic characteristics of the device's field envelope can be suitably tuned in the manner(s) oulined hereinabove such that the field envelope is rendered largely opaque to such very-high-energy emissions—by promoting continuous and adsorptive Compton effect interactions thereof with the field's impinging drive current electrons. When used in association with a ground-based utility or physical plant, a non-propulsive thermal and/or electrical power output model of the Generator may also be enclosed within a suitable Faraday "cage" or shielding structure to further minimize radiative emissions which are undesirable. Nevertheless, the said field envelope tuning principles (related to controlling the amplitude, frequency, and/or phase relationships amid field AC voltage components) may moreover permit the development of the Electrodynamic Field Generator as a novel signal communications means. In pursuit of a new and more complete quantum gravity theory, experiments may be conducted involving the gravimetric coupling of two or more separate such devices: whose field envelopes will by design be able to exhibit a relativistic and oscillatory apparent mass effect that is artificially generated—at desired resonant frequencies—by using alternating electromagnetic induction methods of the type described hereinabove to modulate electrodynamic field properties which are normally of constant polarity and magnitude or random frequency.

Accordingly, it is to be understood that the embodiments of the invention herein described are merely illustrative of the application of the principles of the invention. Reference herein to details of the illustrated embodiments are not intended to limit the scope of the claims, which themselves recite those features regarded as essential to the invention.

What is claimed is:

1. An electrodynamic field generator comprising:
   (a) a disc-shaped hull having upper and lower surfaces separated by a distance at an axis of the disc and tapering to an edge at a perimeter of the disc, enclosing a volume therebetween, the upper and lower surfaces each being divided into a positive section surrounding the axis of the disc, a negative section around the periphery of the disc, and a neutral section therebetween; the positive and negative section surfaces being of conductive material and the neutral section surfaces being of insulative material;
   (b) a rotor having an outer circumference, an inner circumference surrounding an open central aperture, and an annular body therebetween, with the rotor body having flat upper and lower surfaces; the rotor being rotatably mounted within the volume of the hull and centered upon the axis thereof, an inner diameter and outer diameter of the rotor being chosen such that the rotor extends across at least all of the neutral portion of the hull volume and at least part of each positive hull section;
   (c) an evacuated induction compartment and peripheral space charge chamber comprising at least the portion of the hull volume within which the rotor is mounted;
   (d) a principal generating system and corresponding rotor electrical circuit comprising two assemblies, one associated with the upper surface of the rotor and one with the lower surface thereof, each assembly in turn comprising:
      (i) an outer induction electrode array comprising a flat cathode ring mounted upon and electrically coupled to the rotor, adjacent to an outer circumference thereof, and a flat anode ring mounted plane-parallel to, but insulated from, the cathode ring;
      (ii) an inner induction electrode array comprising a flat anode ring mounted upon and electrically coupled to the rotor, a flat cathode ring, and a grid ring element, the cathode and grid being mounted plane-parallel to, but insulated from, the anode and each other; the inner induction ring array being mounted to the rotor closer to the inner circumference thereof than the outer induction ring array;
      (iii) at least one generating coil mounted to the rotor and extending toroidally around the rotor concentric to either circumference thereof, located between the outer induction ring array and the inner induction ring array, and electrically coupled to the cathode of the inner induction array and to the anode of the outer induction array; and
      (iv) a plurality of stationary permanent magnets mounted to the hull, such that the magnetic field from each of the permanent magnets intercepts a generating coil; such that when the rotor is rotated, the magnetic fields from the stationary magnets induce an electrical voltage in each generating coil which results in a DC rotor circuit output current;
   (e) a field induction system comprising two assemblies, one associated with the upper surface of the rotor and one with the lower surface thereof, each assembly in turn comprising:
      (i) at least one plane-parallel electrode array comprising:
         1) a primary anode ring mounted to the rotor adjacent to the inner circumference thereof, between the inner circumference and the inner induction ring array;
         2) at least one primary cathode mounted to, but electrically separated from, each positive section of the hull; and
         3) at least one stationary grid element located between each primary cathode and the corresponding primary anode ring;
      (ii) a primary cathode resistor electrically coupled between each primary cathode and the corresponding positive section of the hull, each cathode resistor being encapsulated by a dielectric buffer; and
      (iii) a principal hull coolant and heat transfer system, thermally coupled to each primary cathode resistor;
   (f) at least one housing charge ballast capacitor, electrically coupled to the principal electrical generating system circuit and to the rotor;
   (g) a plurality of field emitters which are mounted around the outer circumference of the rotor and electrically coupled thereto; and
   (h) a motor drive mounted to the hull, having a mechanical output coupled to the rotor for rotation thereof.

2. The electrodynamic field generator of claim 1, in which:
   (i) the principal electrical generating circuit induces a primary DC voltage between the outer circumference of the rotor and the inner circumference thereof when the rotor is rotated by the motor drive, resulting in a unidirectional rotor current which distributes electron charge from the outer rotor circumference to the negative hull sections; and
   (ii) ii) the field induction system utilizes a portion of the primary DC rotor voltage to establish an external discharge current which expresses a very large expansion of that voltage, within the electric field between the negative and positive sections of the hull, the measure of the expanded field voltage being defined by an engineered instantaneous charge differential between the rotor field emitters and the primary cathodes which is supported by the electric force in one or more housing charge ballast capacitors.

3. The electrodynamic field generator of claim 1 in which the rotor comprises a plurality of conductive radial segments and the same number of nonconductive segment separatorss, with the individual segments and separators uniformly alternating in placement.

4. The electrodynamic field generator of claim 3, in which the conductive rotor segments are made of copper.

5. The electrodynamic field generator of claim 3, in which each generating coil is mounted to the segment separators.

6. The electrodynamic field generator of claim 3 in which the anode of each outer induction array of the principal generating system is mounted to the segment separators, as are the cathode and grid element of each inner induction array.

7. The electrodynamic field generator of claim 1 in which each inner induction array constitutes a triode vacuum-tube construct, the control grid voltage of which biases that array nearly to current cutoff.

8. The electrodynamic field generator of claim 1 in which each of the two assemblies of principal generating system and corresponding rotor electrical circuit comprise a set of three generating coils, arranged across the annular body of the rotor, with each set of coils being sequentially coupled electrically.

9. The electrodynamic field generator of claim 1 in which each generating coil is compound wound, having primary and bias windings.

10. The electrodynamic field generator of claim 1, in which each generating coil further comprises a nonmagnetic core.

11. The electrodynamic field generator of claim 1, in which each generating coil further comprises a powdered ironi core.

12. The electrodynamic field generator of claim 1 in which the stationary permanent magnets are C-shaped, and are arranged into a circular body with a flux gap and wherein the magnetic field passes through the flux gap, and the generating coils are positioned to pass through the flux gaps of the magnets in a uniform manner during rotation of the rotor.

13. The electrodynamic field generator of claim 1, in which the magnets are made of an alnico family alloy.

14. The electrodynamic field generator of claim 1 in which a housing charge ballast capacitor is mounted upon the rotor between each outer induction array and the rotor's outer circumference, each ballast capacitor having an inner conductive ring electrically connected to the rotor, an outer conductive ring plane-parallel to the inner ring and electrically connected to the outer induction array anode, and a dielectric layer between its inner and outer rings.

15. The electrodynamic field generator of claim 1 in which the field emitters are made of a sintered refractory composite material which is electrically conductive, and have a shape such that they taper from an inner end or surface having a thickness equal to a thickness of the rotor's outer circumference to a slightly blunted edge at an outer end forming an outermost circumference of the rotor and field emitters.

16. The electrodynamic field generator of claim 9 in which each assembly of the principal generating system and corresponding rotor electrical subcircuit comprises one or more AC subcircuitry stages, each stage being mounted to the rotor for rotation therewith and in turn comprising:
  an AC input, or grid resistor;
  one or more bias windings electrically coupled to the AC input;
  a triode array electrically coupled to the AC input and to that input's corresponding bias winding or windings, comprising a cathode, an anode, and a control grid; and
  an output, or plate resistor, electrically coupled to the anode of that triode array or to the anode of a successive electrode array.

17. The electrodynamic field generator of claim 16 in which a plurality of AC stages are electrically coupled in series, the input of an outermost stage closest to the outer circumference of the rotor being coupled to the outer induction array anode and the output of an innermost stage closest to the inner rotor circumference being coupled to the control grid of the inner induction array.

18. The electrodynamic field generator of claim 17 in which each assembly of the principal generating system, and the corresponding rotor electrical subcircuit, comprises three AC stages.

19. The electrodynamic field generator of claim 1 in which the plane-parallel electrode arrays comprising the field induction system each in turn comprise a primary cathode, three grid elements, and an anode ring and therefore constitute pentode vacuum-tube constructs.

20. The electrodynamic field generator of claim 1, in which a voltage control system is electrically or thermally coupled to at least one stationary electrode of each plane-parallel array comprising the field induction system such that the total discharge current is limited to a value within the total ampacity of the rotor segments.

21. The electrodynamic field generator of claim 20, in which the operating electrode temperature is controlled by movable thermal adjusting rods that may be thermally coupled to one or more of the cathodes or grids and to a cryogenic heat sink.

22. The electrodynamic field generator of claim 20, in which the voltage control system is further utilized to apply inverse AC signal feedback to the discharge current such that rotor circuit AC voltage amplitude is limited to a desired or requisite value.

23. The electrodynamic field generator of claim 1 in which each positive section of the hull is divided into a plurality of radial sectors, each sector being separated from adjoining sectors by an insulating partition.

24. The electrodynamic field generator of claim 23 in which each assembly of the field induction system comprises a plurality of plane-parallel electrode arrays, with each array being electrically coupled to a radial sector of a positive hull section.

25. The electrodynamic field generator of claim 23, in which each positive hull section is divided into 36 radial sectors.

26. The electrodynamic field generator of claim 23 further comprising a center sector of each positive hull section, located at the axis of the hull, these sectors each being electrically isolated from the radial sectors of the respective positive hull section.

27. The electrodynamic field generator of claim 26, in which each center sector is made of an insulating material.

28. The electrodynamic field generator of claim 26, in which single radial sectors at four cardinal points of each positive hull section are electrically connected in parallel with a conductive center sector of that positive hull section.

29. The electrodynamic field generator of claim 1, in which the principal hull-coolant system comprises one or more primary thermal conduits conveying a high-temperature heat transfer fluid and incorporates a heater to pre-heat that heat transfer fluid and, in turn, the cathode resistors, dielectric buffers, and primary cathodes.

30. The electrodynamic field generator of claim 29, in which the high-temperature heat transfer fluid is liquid sodium.

31. The electrodynamic field generator of claim 1 in which the primary cathode material is selected from a group consisting of pure tungsten metal and tungsten, as well as alloys thereof, which is or have been impregnated with thorium.

32. The electrodynamic field generator of claim 1, in which the primary cathode resistors are made of a ceramic material which becomes electrically conductive at an elevated operating temperature.

33. The electrodynamic field generator of claim 32, in which the ceramic cathode resistor material is selected from a group consisting of the steatite and cordierite families of compounds.

34. The electrodynamic field generator of claim 1, in which the dielectric buffer encapsulating each primary cathode resistor is made of sodium bismuth titanate.

35. The electrodynamic field generator of claim 1, further comprising a secondary hull coolant or heat transfer system which in turn comprises one or more secondary thermal conduits conveying a heat transfer fluid and which is thermally coupled to the neutral and negative sections of the hull.

36. The electrodynamic field generator of claim 35, in which the heat transfer fluid is a cryogenic coolant.

37. The electrodynamic field generator of claim 36, in which the heat transfer fluid is a liquefied gas selected from the group consisting of liquid air, liquid nitrogen, and liquid helium.

38. The electrodynamic field generator of claim 1 further comprising a plurality of stationary electromagnetic armatures arranged in two circular groups or arrays within the hull volume, one array above the upper surface of the rotor and one below the lower surface thereof, each armature comprising:

a ferromagnetic body or core having a first end section adjacent to the rotor, a second end section adjacent to a neutral section of the hull, and a length therebetween which is of a reduced cross-sectional area with respect to either end section; and at least one electrical winding wound on either end section of the core, wherein an electric current in the winding induces a magnetic field in the core which is superimposed on the rotor or on the external electric field.

39. The electrodynamic field generator of claim 38 in which each of the armatures has two windings, comprising:

a first winding on the first end section, wherein a current in the first winding causes a magnetic field to be superimposed on the rotor; and a second winding on the second end section, wherein a current in the second winding causes a magnetic field to be superimposed on the external field.

40. The electrodynamic field generator of claim 38, in which the armature core material is selected from a group consisting of pure annealed iron and low-carbon steels.

41. The electrodynamic field generator of claim 38, further comprising a DC power supply electrically coupled to at least one winding of each stationary armature.

42. The electrodynamic field generator of claim 38, further comprising an AC power source electrically coupled to at least one winding of each stationary armature.

43. The electrodynamic field generator of claim 1, in which the mechanical output of one or more motor drives is coupled to the rotor through a gear on each motor drive's mechanical output meshing with one or more driven ring gears about the inner circumference of the rotor.

44. The electrodynamic field generator of claim 1 further comprising a pair of rolling bearing assemblies or ballraces for supporting the rotor, one around the upper surface of the rotor and one around the lower surface thereof with both ballraces being mounted near the rotor's outer circumference; each ballrace comprising a first race half or raceway mounted on the rotor and a second raceway mounted to the hull opposite the first raceway, defining a bearing ball passage therebetween, and a plurality of bearing balls contained in the ball passage.

45. The electrodynamic field generator of claim 1, further comprising a central control cabin inside the hull within the aperture or inner circumference of the rotor.

46. The electrodynamic field generator of claim 1, in which the cathode resistors each comprise a fixed positive reduced-voltage tap whereby an onboard or external electrical load may be connected between the fixed taps and the primary cathodes.

47. The electrodynamic field generator of claim 1, in which the heat transfer system is thermally coupled to an external heat exchanger.

48. The electrodynamic field generator of claim 1, comprising one or more superconductive current storage rings utilized to deposit and retrieve an expendable store of ambient electron charge during extended operation in the vacuum of space.

* * * * *